US012360451B2

(12) United States Patent
Koh et al.

(10) Patent No.: US 12,360,451 B2
(45) Date of Patent: *Jul. 15, 2025

(54) METHOD OF MANUFACTURING SEMICONDUCTOR DEVICE

(71) Applicant: SAMSUNG ELECTRONICS CO., LTD., Suwon-si (KR)

(72) Inventors: Chawon Koh, Yongin-si (KR); Tsunehiro Nishi, Suwon-si (KR); Hyunwoo Kim, Seongnam-si (KR); Jinkyun Lee, Incheon (KR); Junil Kim, Suncheon-si (KR); Hyuntaek Oh, Incheon (KR); Jihoon Woo, Incheon (KR); Seungsoo Choi, Incheon (KR)

(73) Assignees: SAMSUNG ELECTRONICS CO., LTD., Suwon-si (KR); INHA Industry Partnership Institute, Incheon (KR)

( * ) Notice: Subject to any disclaimer, the term of this patent is extended or adjusted under 35 U.S.C. 154(b) by 571 days.

This patent is subject to a terminal disclaimer.

(21) Appl. No.: 17/696,030

(22) Filed: Mar. 16, 2022

(65) Prior Publication Data
US 2022/0299874 A1    Sep. 22, 2022

(30) Foreign Application Priority Data
Mar. 19, 2021   (KR) ......................... 10-2021-0036204

(51) Int. Cl.
*G03F 7/038*    (2006.01)
*G03F 7/20*     (2006.01)
(Continued)

(52) U.S. Cl.
CPC .......... *G03F 7/0382* (2013.01); *G03F 7/2006* (2013.01); *G03F 7/325* (2013.01); *G03F 7/40* (2013.01)

(58) Field of Classification Search
CPC .............................. G03F 7/0042; G03F 7/0043
See application file for complete search history.

(56) References Cited

U.S. PATENT DOCUMENTS

| 8,163,462 B2 | 4/2012 | Toriumi et al. |
| 8,366,967 B2 | 2/2013 | Keszler et al. |

(Continued)

FOREIGN PATENT DOCUMENTS

| JP | 4420774 B2 | 2/2010 |
| KR | 10-2020-0098784 A | 8/2020 |

(Continued)

OTHER PUBLICATIONS

Murotani et al., "Cross-Linkable Molecular Glasses: Low Dielectric Constant Materials Patternable in Hydrofluoroethers", 2009, ACS Applied Materials & Interfaces, vol. 1 No. 10, 2363-2370. (Year: 2009).*

(Continued)

*Primary Examiner* — Geraldina Visconti
*Assistant Examiner* — Anna Malloy
(74) *Attorney, Agent, or Firm* — Muir Patent Law, PLLC

(57) ABSTRACT

A method of manufacturing a semiconductor device, the method including forming a photoresist material layer on a lower film, the photoresist material layer including a crosslinking molecule having a molecular weight of about 1,000 to about 4,000; exposing a partial region of the photoresist material layer; removing an unexposed portion of the photoresist material layer to form a photoresist pattern; and processing the lower film using the photoresist pattern, wherein the crosslinking molecule includes a perfluoro alkyl moiety, the perfluoro alkyl moiety including a carbonfluorine bond that dissociates in response to the exposing of the partial region of the photoresist material layer.

20 Claims, 13 Drawing Sheets

(51) Int. Cl.
  *G03F 7/32*     (2006.01)
  *G03F 7/40*     (2006.01)

(56)         References Cited

U.S. PATENT DOCUMENTS

| | | |
|---|---|---|
| 8,415,000 B2 | 4/2013 | Stowers et al. |
| 9,176,377 B2 | 11/2015 | Stowers et al. |
| 9,281,207 B2 | 3/2016 | Stowers et al. |
| 9,310,684 B2 | 4/2016 | Meyers et al. |
| 9,823,564 B2 | 11/2017 | Stowers et al. |
| 10,025,179 B2 | 7/2018 | Meyers et al. |
| 11,720,022 B2 * | 8/2023 | Lee .................. G03F 7/0046 430/270.1 |
| 2010/0104985 A1 | 4/2010 | Watanabe |
| 2018/0307137 A1 | 10/2018 | Meyers et al. |

FOREIGN PATENT DOCUMENTS

| | | |
|---|---|---|
| KR | 10-2215511 B1 | 2/2021 |
| WO | WO 2017-055850 A1 | 4/2017 |

OTHER PUBLICATIONS

Chambers, et al., Fluorine in Organic Chemistry, CRC Press, p. 164 (2004).
Murotani, Eisuke, et al., "Cross-linkable molecular glasses: low dielectric constant materials patternable in hydrofluoroethers," ACS applied materials & interfaces 1.10 (2009): 2363-2370.
Office Action dated Jan. 15, 2025 for corresponding KR Patent Application No. 10-2021-0036204.

* cited by examiner

METHOD OF MANUFACTURING SEMICONDUCTOR DEVICE

CROSS-REFERENCE TO RELATED APPLICATION

This application is based on and claims priority under 35 U.S.C. § 119 to Korean Patent Application No. 10-2021-0036204, filed on Mar. 19, 2021, in the Korean Intellectual Property Office, the disclosure of which is incorporated by reference herein in its entirety.

BACKGROUND

1. Field

Embodiments relate to a method of manufacturing a semiconductor device.

2. Description of the Related Art

In order to apply an extreme ultraviolet (EUV) lithography technique, the effectiveness of EUV photons may be maximized.

SUMMARY

The embodiments may be realized by providing a method of manufacturing a semiconductor device, the method including forming a photoresist material layer on a lower film, the photoresist material layer including a crosslinking molecule having a molecular weight of about 1,000 to about 4,000; exposing a partial region of the photoresist material layer; removing an unexposed portion of the photoresist material layer to form a photoresist pattern; and processing the lower film using the photoresist pattern, wherein the crosslinking molecule includes a perfluoro alkyl moiety, the perfluoro alkyl moiety including a carbon-fluorine bond that dissociates in response to the exposing of the partial region of the photoresist material layer.

The embodiments may be realized by providing a method of manufacturing a semiconductor device, the method including forming a photoresist material layer on a lower film, the photoresist material layer including a crosslinking molecule represented by Formula 1, Formula 2, or Formula 3; exposing a partial region of the photoresist material layer; removing an unexposed portion of the photoresist material layer to form a photoresist pattern; and processing the lower film using the photoresist pattern,

[Formula 1]

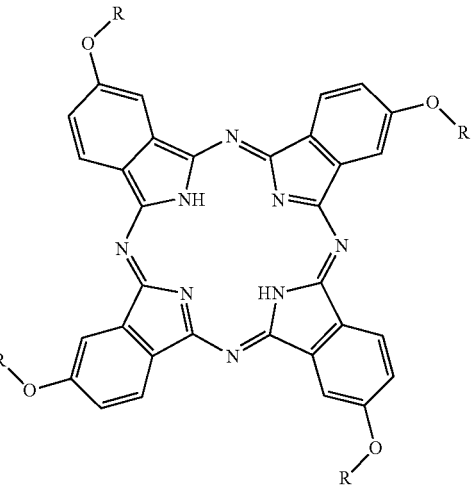

[Formula 2]

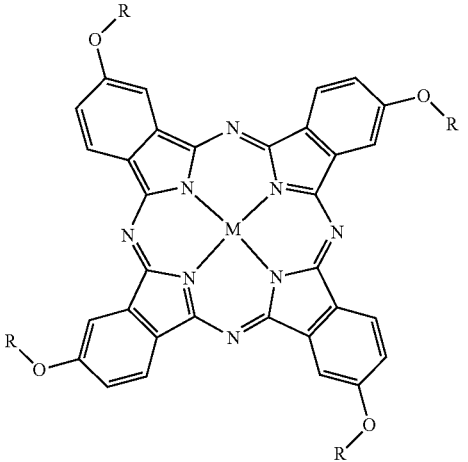

[formula 3]

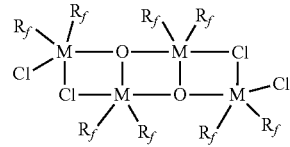

wherein, in Formulae 1 to 3, M is tin (Sn), zinc (Zn), lithium (Li), sodium (Na), potassium (K), beryllium (Be), magnesium (Mg), calcium (Ca), barium (Ba), aluminum (Al), silicon (Si), cadmium (Cd), mercury (Hg), chromium (Cr), iron (Fe), cobalt (Co), nickel (Ni), copper (Cu), germanium (Ge), palladium (Pd), platinum (Pt), lead (Pb), strontium (Sr), or manganese (Mn), and R and $R_f$ are each independently $-C_aF_bH_c(N,P)_d(S,O)_e$, in which a is an integer of 1 to 20, each of d and e is independently an integer of 0 to 5, c is an integer of 0 to 20, $b \geq (a+c)$, and $(b+c)=2a+2+d$.

The embodiments may be realized by providing a method of manufacturing a semiconductor device, the method including forming a photoresist material layer on a lower film, the photoresist material layer including a crosslinking molecule represented by Formula 1, Formula 2-1, Formula 2-2, or Formula 3-1; exposing a partial region of the photoresist material layer; baking the photoresist material layer; removing an unexposed portion of the baked photoresist material layer to form a photoresist pattern; and processing the lower film using the photoresist pattern,

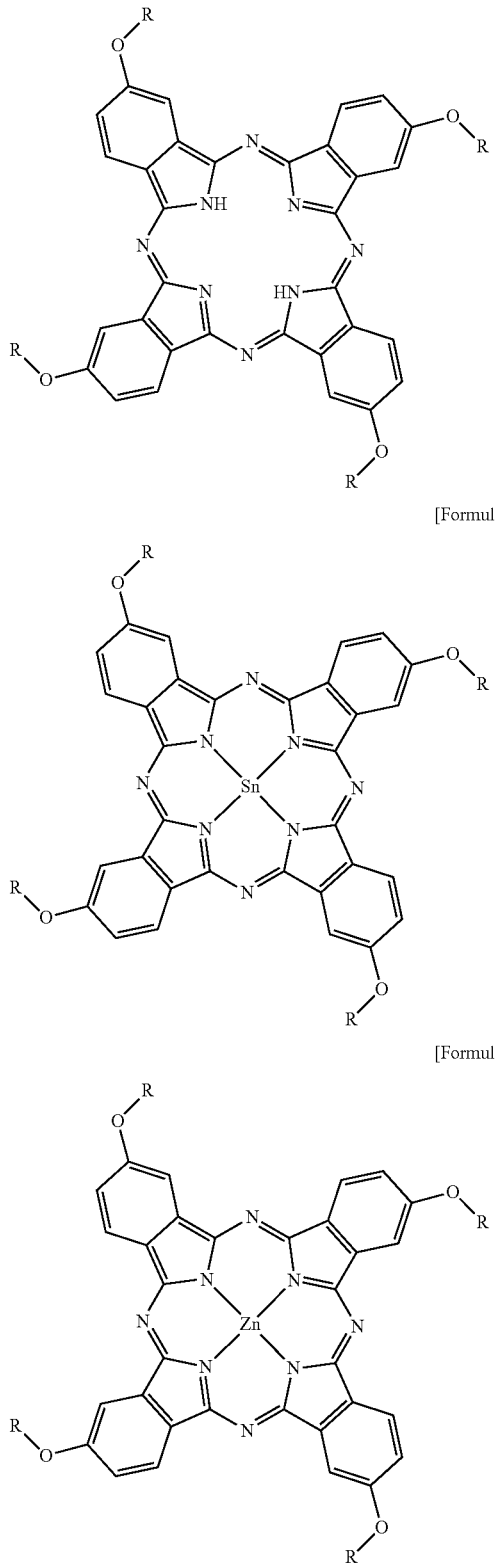

[Formula 1]

[Formula 2-1]

[Formula 2-2]

-continued

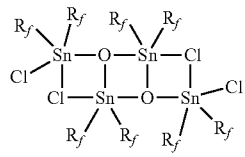

[Formula 3-1]

wherein, in Formulae 1 to 3-1, R is —CF$_2$CHF—O—R', in which R' is —C$_3$F$_7$, —C$_3$OF$_7$, —C$_4$F$_9$, —C$_4$OF$_9$, —C$_5$F$_{11}$, —C$_5$OF$_{11}$, —C$_6$F$_{13}$, —C$_6$OF$_{13}$, —C$_7$F$_{15}$, or —C$_7$OF$_{15}$, R$_f$ is —(CH$_2$)$_p$(CF$_2$)$_q$CF$_3$, in which p is an integer of 0 to 3, and q is an integer of 2 to 9.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
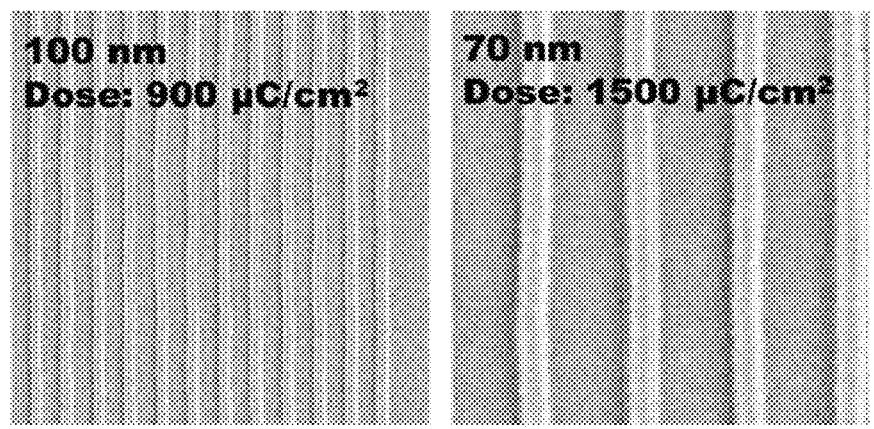
FIG. 1 shows images of a negative-type resist pattern of SnPc-PFAE$_L$ resist, which was formed by performing an electronic beam (e-beam) lithography process according to Example 9.

A photoresist composition according to an embodiment may include, e.g., a crosslinking molecule having a molecular weight of about 1,000 to about 4,000 and a solvent.

The crosslinking molecule may include a plurality of —CH$_{3-i}$X$_i$ groups, e.g., in which X may be a halogen element, and i may be an integer of 1 to 3. In an implementation, the —CH$_{3-i}$X$_i$ group may be irradiated with light having a specific wavelength or electron beams (e-beams) and may be dissociated to form radicals, and may form a covalent bond with other dissociated radicals. In an implementation, in a region irradiated with the light having a specific wavelength or electron beams, the plurality of dissociated —CH$_{3-i}$X$_i$ groups of the crosslinking molecule may form a plurality of covalent bonds with dissociated —$CH_{3-i}X_i$ groups of other crosslinking molecule(s), thereby forming a macromolecule.

In an implementation, the halogen element may include, e.g., chlorine or fluorine. In an implementation, the crosslinking molecule may include, e.g., a perfluoro alkyl moiety. The perfluoro alkyl moiety may include at least one carbon-fluorine bond that may be dissociated due or in response to the irradiation of light having the specific wavelength, or e-beams. Although electron beams themselves are not light, hereinafter, 'light' will include electron beams for brevity, and 'exposing the crosslinking molecule to light' or 'exposure' will also include exposing the crosslinking molecule to electron beams. As used herein, the term "or" is not an exclusive term, e.g., "A or B" would include A, B, or A and B.

In an implementation, the crosslinking molecule may be a molecule in which at least two perfluoro alkyl moieties are bonded to a phthalocyanine backbone. The perfluoro alkyl moiety may include, e.g., a —$CH_{3-i}X_i$ group. In an implementation, the perfluoro alkyl moiety may be represented by, e.g., —$C_aF_bH_c(N,P)_d(S,O)_e$, which will be described below in further detail. In the Chemical Formulae or structures, e.g., —$C_aF_bH_c(N,P)_d(S,O)_e$, the atoms are not necessarily included only in the order illustrated, and the formula may represent any suitable moiety including the described atoms in the described numbers.

Herein, $(N,P)_d$ may mean that the number of nitrogen (N) atoms and phosphorus (P) atoms included (e.g., anywhere) in the perfluoro alkyl moiety is d, and $(S,O)_e$ may mean that the number of sulfur (S) atoms and oxygen (O) atoms included (e.g., anywhere) in the perfluoro alkyl moiety is e.

In an implementation, the crosslinking molecule may be, e.g., a metal organic compound containing a metal (including, e.g., a metalloid). In an implementation, the metal may include, e.g., tin (Sn), zinc (Zn), lithium (Li), sodium (Na), potassium (K), beryllium (Be), magnesium (Mg), calcium (Ca), barium (Ba), aluminum (Al), silicon (Si), cadmium (Cd), mercury (Hg), chromium (Cr), iron (Fe), cobalt (Co), nickel (Ni), copper (Cu), germanium (Ge), palladium (Pd), platinum (Pt), lead (Pb), strontium (Sr), or manganese (Mn). In an implementation, the crosslinking molecule may be a metal organic compound in which the phthalocyanine backbone is coordinated to the metal.

In an implementation, the crosslinking molecule may be represented by, e.g., Formula 1, Formula 2, or Formula 3.

[Formula 1]

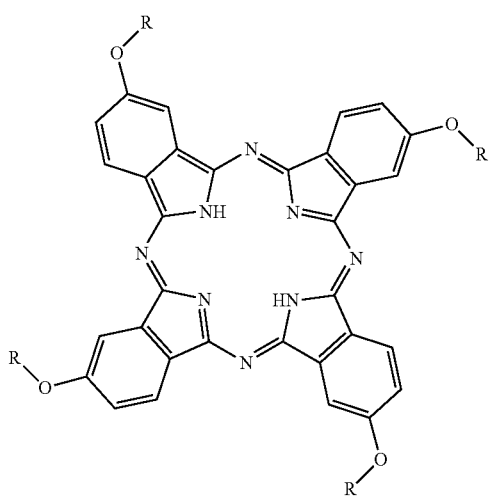

[Formula 2]

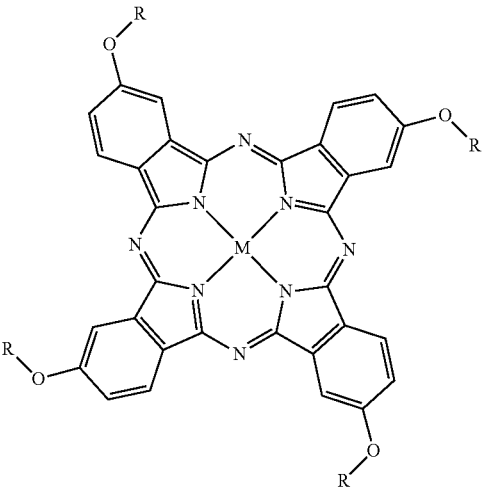

[Formula 3]

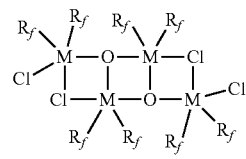

In Formulae 1 to 3, M may be, e.g., tin (Sn), zinc (Zn), lithium (Li), sodium (Na), potassium (K), beryllium (Be), magnesium (Mg), calcium (Ca), barium (Ba), aluminum (Al), silicon (Si), cadmium (Cd), mercury (Hg), chromium (Cr), iron (Fe), cobalt (Co), nickel (Ni), copper (Cu), germanium (Ge), palladium (Pd), platinum (Pt), lead (Pb), strontium (Sr), or manganese (Mn).

In an implementation, R and Rf may each independently be represented by, e.g., —$C_aF_bH_c(N,P)_d(S,O)_e$, in which a may be an integer of 1 to 20, d and e may each independently be an integer of 0 to 5, c may be an integer of 0 to 20, $b \geq (a+c)$, and $(b+c)=2a+2+d$. In an implementation, each of R and $R_f$ may include a —$CH_{3-i}X_i$ group mentioned above.

In an implementation, the crosslinking molecule may have a structure of Formula 1 or Formula 2, and R may be, e.g., —$C_aF_bH_c(S,O)_e$. In an implementation, a may be, e.g., an integer of 5 to 10, e may be, e.g., 1 or 2, and c may be, e.g., an integer of 0 to 2. In an implementation, R may be, e.g., —$CF_2CHF$—O—R', in which R' may be —$C_3F_7$, —$C_3OF_7$, —$C_4F_9$, —$C_4OF_9$, —$C_5F_{11}$, —$C_5OF_{11}$, —$C_6F_{13}$, —$C_6OF_{13}$, —$C_7F_{15}$, or —$C_7OF_{15}$. In an implementation, R' may be, e.g., —$C_mF_{2m}$—O—$C_nF_{2n+1}$, in which m and n may each independently be an integer of 1 to 6, and (m+n) may be an integer of 3 to 7.

In an implementation, R may include, e.g., a functional group represented by Formula 4.

[Formula 4]

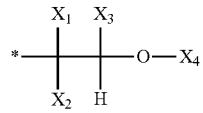

In Formula 4, $X_1$, $X_2$, and $X_3$ may each independently be, e.g., a halogen, and $X_4$ may be or include, e.g., a C1 to C10 perhalogenated alkyl group or a C1 to C10 perhalogenated alkyl ether halogenated alkyl group.

In an implementation, each of $X_1$, $X_2$, and $X_3$ of Formula 4 may be fluorine, and $X_4$ may be, e.g., a C1 to C10 perfluoro alkyl group or a C1 to C10 perfluoroalkyl ether fluoroalkyl group.

In an implementation, R may be, e.g., —$CF_2CHF$—O—$CF_2C(CF_3)F$—O—$(CF_2)_2CF_3$ or —$CF_2CHF$—O—$(CF_2)_3$—O—$CF_3$.

In Formula 2, a plurality of lines connected to the metal M may be covalent bonds or coordinate bonds. In an implementation, in Formula 2, some of the plurality of lines connected to the metal M may be covalent bonds, and others thereof may be coordinate bonds.

In Formula 3, three lines bonded to oxygen may be oxygen-capped trimer bonds.

In an implementation, the crosslinking molecule may be represented by, e.g., Formula 2-1, Formula 2-2, or Formula 3-1.

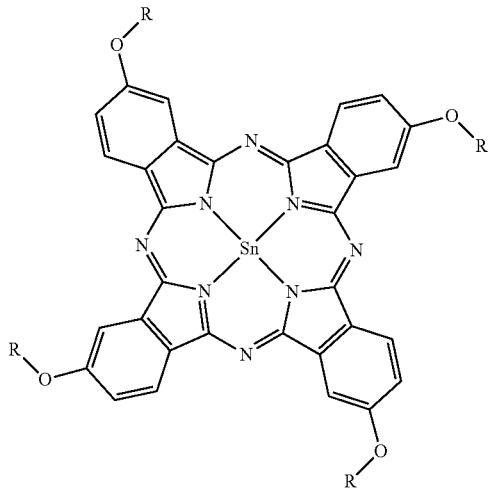

[Formula 2-1]

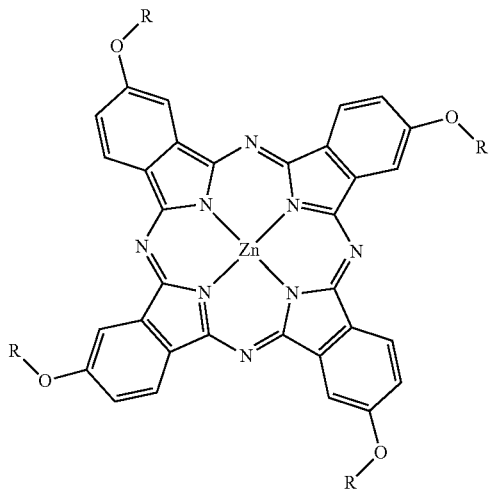

[Formula 2-2]

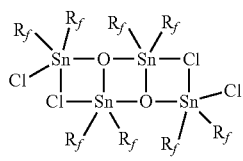

[Formula 3-1]

In Formula 2-1, Formula 2-2, and Formula 3-1, R and Rf may be the same as described with reference to Formulas 1 to 3. In an implementation, R may be, e.g., —$CF_2CHF$—O—R', in which R' may be —$C_3F_7$, —$C_3OF_7$, —$C_4F_9$, —$C_4OF_9$, —$C_5F_{11}$, —$C_5OF_{11}$, —$C_6F_{13}$, —$C_6OF_{13}$, —$C_7F_{15}$, or —$C_7OF_{15}$, and Rf may be, e.g., —$(CH_2)_p(CF_2)_q$$CF_3$. In an implementation, e.g., p may be an integer of 0 to 10 or 0 to 3, and q may be an integer of 0 to 10, 2 to 9, or 0 to 5. In an implementation, q may be equal to or greater than 2p.

In Formulae 2-1 and 2-2, a plurality of lines connected to metals Sn and Zn may be covalent bonds or coordinate bonds. In an implementation, in Formulae 2-1 and 2-2, some of the plurality of lines connected to the metals Sn and Zn may be covalent bonds, and others thereof may be coordinate bonds.

In an implementation, a molecular weight of the crosslinking molecule may be, e.g., about 1000 to about 5000, about 1200 to about 4800, about 1400 to about 4600, about 1600 to about 4400, about 1800 to about 4200, or about 2000 to about 4000. When a molecular weight of the crosslinking molecule fails within the above-described range, appropriate dispersibility and etch resistance may be ensured.

In the crosslinking molecules having the structures of Formulas 1 to 3, perfluoro moieties may be easily crosslinked due to exposure or extreme ultraviolet (EUV) irradiation, and thus, relatively strong crosslinking bonds may be obtained to help prevent pattern collapse. In addition, an etch resistance may be greatly improved due to a metal contained in the crosslinking molecule. In an implementation, a phthalocyanine structure and a metal cluster structure included in the crosslinking molecule may facilitate relatively high sensitivity and resolution, compared to another non-chemically amplified resist that is based on an organic material. In addition, in other processes, because a complicated process, such as a litho-etch-litho-etch (LELE) process, may be used to form a fine pattern, and finally generated patterns may exhibit a poor critical dimension (CD) distribution. In an implementation, when the crosslinking molecules having the structures of, e.g., one of Formulae 1 to 3 are used, a hyperfine pattern that may help prevent pattern collapse and has a high etch resistance may be obtained using a single lithography process, and thus, an excellent CD distribution may be obtained, and manufacturing cost may be reduced.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

<Example 1> Synthesis of Perfluoroalkyl Ether (L-Type) Introduced Phthalonitrile (PN-PFAE$_L$)

3.0 g (20.8 mmol) of 4-hydroxyphthalonitrile(4-hydroxyphthalonitrile), 13.5 g (31.2 mmol) of 2-(heptafluoropropoxy)hexafluoropropyl trifluorovinyl ether, 5.8 g (41.6 mmol) of potassium carbonate ($K_2CO_3$), and 35 cm³ of dimethylformamide (DMF) were put into a 100 cm³ 2-neck round flask. The reaction solution was stirred at a temperature of about 60° C. for about 3 hours and cooled to ambient temperature. A reactant was diluted with 30 cm³ of diethyl ether, washed with water and a saturated sodium chloride water solution, and extracted, and residual moisture was removed using magnesium persulfate (MgSO$_4$). A solution obtained by concentration under reduced pressure was passed through a silica column in vacuum using dimethyl ether. The passed solution was concentrated and purified using a chromatography method (silica gel, ethyl acetate:hexane=1:3) to obtain liquid PN-PFAE$_L$ (5.5 g yield: 46%).

$^1$H NMR (400 MHz, CDCl$_3$, ppm): δ=7.87 (d, J=8.6 Hz, 1H, ArH), 7.61 (s, 1H, ArH), 7.56 (d, J=8.7 Hz, 1H, ArH), 6.12 (d, J=53.3 Hz, 1H, CF$_2$CFHO).

Chemical equation 1 below shows a synthesis chemical equation of perfluoroalkyl ether(L) substituted phthalonitrile (PN-PFAE$_L$), which is a precursor of phthalocyanine.

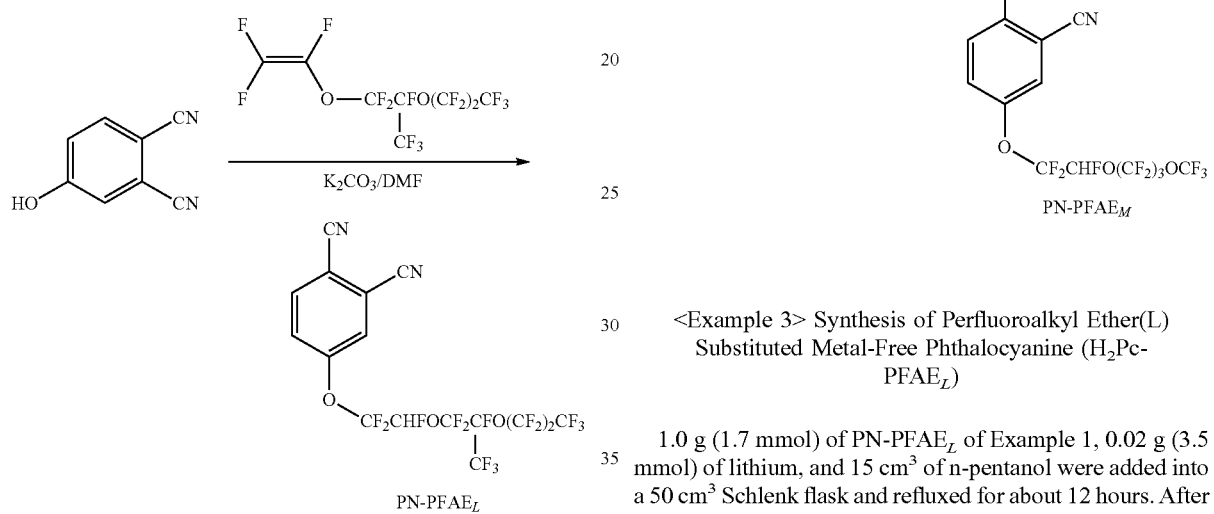

<Chemical equation 1>

PN-PFAE$_L$

<Example 2> Synthesis of Perfluoroalkyl Ether (M-Type) Introduced Phthalonitrile (PN-PFAE$_M$)

2.0 g (13.9 mmol) of 4-hydroxyphthalonitrile, 6.9 g (20.8 mmol) of 1,1,2,2,3,3-hexafluoro-1-(trifluoromethoxy)-3-[(1,2,2-trifluorovinyl)oxy]propane, 3.8 g (27.8 mmol) of potassium carbonate, and 20 cm$^3$ of DMF were put into a 100 cm$^3$ 2-neck round flask. The reaction solution was stirred at a temperature of about 60° C. for about 3 hours and cooled to ambient temperature. A reactant was diluted with 30 cm$^3$ of diethyl ether, washed with water and a saturated sodium chloride water solution, and extracted, and residual moisture was removed using magnesium persulfate (MgSO$_4$). A solution obtained by concentration under reduced pressure was passed through a silica column in vacuum using diethyl ether. The passed solution was concentrated and purified using a chromatography method (silica gel, ethyl acetate:hexane=1:3) to obtain liquid PN-PFAE$_M$ (4.0 g yield: 61%).

$^1$H NMR (400 MHz, CDCl$_3$, ppm): δ=7.88 (d, J=8.3 Hz, 1H, ArH), 7.64 (s, 1H, ArH), 7.58 (d, J=8.4 Hz, 1H, ArH), 6.14 (d, J=53.2 Hz, 1H, CF$_2$CFHO).

Chemical equation 2 shows a synthesis chemical equation of perfluoroalkyl ether(M) substituted phthalonitrile, PN-PFAE$_M$), which is a precursor of phthalocyanine.

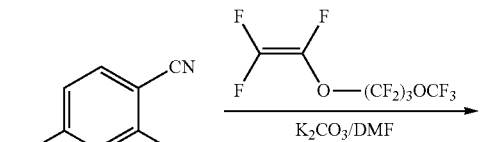

<Chemical equation 2>

PN-PFAE$_M$

<Example 3> Synthesis of Perfluoroalkyl Ether(L) Substituted Metal-Free Phthalocyanine (H$_2$Pc-PFAE$_L$)

1.0 g (1.7 mmol) of PN-PFAE$_L$ of Example 1, 0.02 g (3.5 mmol) of lithium, and 15 cm$^3$ of n-pentanol were added into a 50 cm$^3$ Schlenk flask and refluxed for about 12 hours. After being cooled to ambient temperature, the reaction solution was precipitated in a 1:2 mixture of a 2% hydrochloric water solution and methanol, and a solid precipitate was then obtained by filtration. The solid product was refluxed in methanol for about 2 hours, recovered using a centrifuge, stirred again in n-hexane, and filtered to obtain a product. After being dried in vacuum, 0.07 g of H$_2$Pc-PFAE$_L$ was obtained as a final product (0.4 g, yield: 40%). IR [(KBR): ν$_{max}$, (cm$^{-1}$)] 3292(N—H), 1724, 1616, 1479, 1313, 1242, 1200, 1161, 1124, 993.

Chemical equation 3 below shows a synthesis chemical equation of perfluoroalkyl ether(L) substituted metal-free phthalocyanine (H$_2$Pc-PFAE$_L$).

<Chemical equation 3>

PN-PFAE$_L$

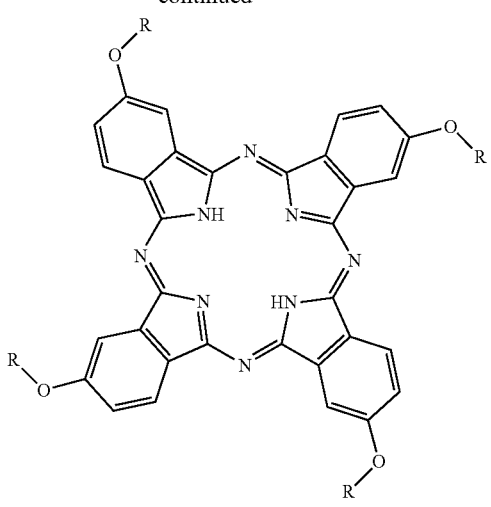

H₂Pc-PFAE$_L$

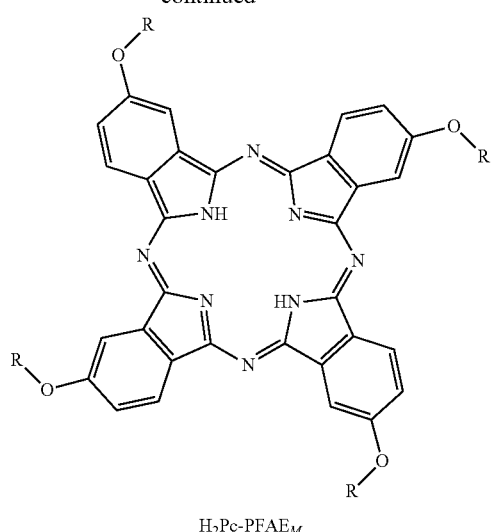

H₂Pc-PFAE$_M$

R: —CF$_2$CHFOCF$_2$CFO(CF$_2$)$_2$CF$_3$
       |
       CF$_3$

R: —CF$_2$CHFO(CF$_2$)$_3$OCF$_3$

<Example 4> Synthesis of Perfluoroalkyl Ether(M) Substituted Metal-Free Phthalocyanine, H₂Pc-PFAE$_M$ 1.0 g (2.1 mmol) of PN-PFAE$_M$ of Example 1, 0.03 g (4.2 mmol) of lithium, and 5 cm³ of n-pentanol were added into a 25 cm³ Schlenk flask and refluxed for about five hours. After being cooled to ambient temperature, the reaction solution was precipitated in a 1:2 mixture of a 2% hydrochloric water solution and methanol, and a solid precipitate was then obtained by filtration. The solid product was refluxed in methanol for about 2 hours, recovered using a centrifuge, stirred again in n-hexane, and filtered to obtain a product. After being dried in vacuum, 0.07 g of H₂Pc-PFAE$_M$ was obtained as a final product (0.3 g, yield: 30%). IR [(KBR): v$_{max}$, (cm⁻¹)] 3292, 1724, 1616, 1479, 1344, 1280, 1203, 1126, 989.

Chemical equation 4 below shows a synthesis chemical equation of perfluoroalkyl ether(M) substituted metal-free phthalocyanine (H₂Pc-PFAE$_M$).

<Example 5> Synthesis of Perfluoroalkyl Ether(L) Substituted Tin-Phthalocyanine (SnPc-PFAE$_L$)

2.0 g (3.5 mmol) of PN-PFAE$_L$, 0.2 g (0.9 mmol) of tin(II) chloride, 0.1 g (0.7 mmol) of 1,8-diazabicyclo[5,4,0]undec-7-ene (DBU), and 30 cm³ of n-pentanol were added into a 50 cm³ round flask and refluxed for about 24 hours. After being cooled to ambient temperature, a precipitated product was filtered and obtained and then refluxed in methanol for about 1 hour. A solid obtained after filtration was refluxed in hexane for about 1 hour and then filtered. After being dried in vacuum, 0.7 g of SnPc-PFAE$_L$ was obtained as a final product (0.4 g, yield: 33%). UV-Vis (tetrahydrofuran (THF): λ$_{max}$ (nm) (log ε) 686. IR [(KBR): v$_{max}$, (cm⁻¹)] 3140, 2930, 2730, 2630, 1910, 1770, 1730, 1610, 1480, 1400, 1310, 1260, 1210, 1120, 995.

Chemical equation 5 below shows a synthesis chemical equation of perfluoroalkyl ether(L) substituted tin-phthalocyanine (SnPc-PFAE$_L$).

<Chemical equation 4>

<Chemical equation 5>

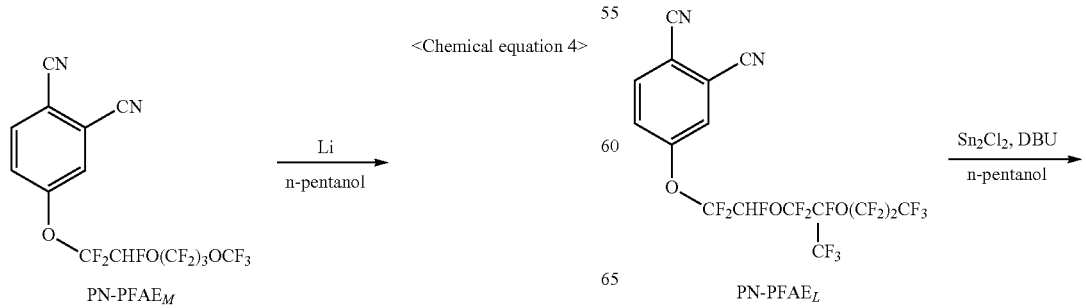

PN-PFAE$_M$

PN-PFAE$_L$

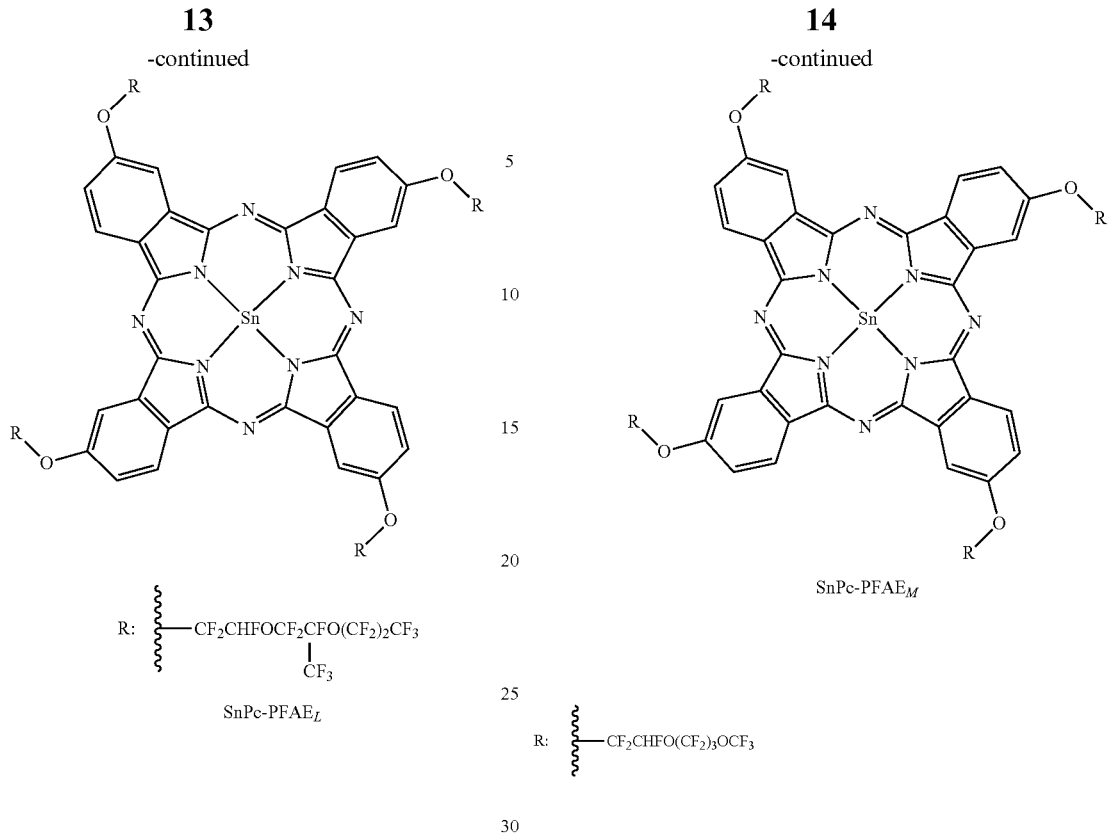

R: ⸺CF₂CHFOCF₂CFO(CF₂)₂CF₃
         |
         CF₃

SnPc-PFAE$_L$

SnPc-PFAE$_M$

R: ⸺CF₂CHFO(CF₂)₃OCF₃

<Example 6> Synthesis of Perfluoroalkyl Ether(M) Substituted Tin-Phthalocyanine (SnPc-PFAE$_M$)

2.0 g (4.2 mmol) of PN-PFAE$_M$, 0.2 g (1.3 mmol) of tin (II) chloride, 0.1 g (0.8 mmol) of DBU, and 30 cm³ of n-pentanol were added into a 50 cm³ round flask and refluxed for about 24 hours. After being cooled to ambient temperature, a precipitated product was filtered and obtained and then refluxed in methanol for about 1 hour. A solid obtained after filtration was reflexed in hexane for about 1 hour and then filtered. After being dried in vacuum, 0.7 g of SnPc-PFAE$_M$ was obtained as a final product (0.8 g, yield: 38%).

Chemical equation 6 below shows a synthesis chemical equation of perfluoroalkyl ether(M) substituted tin-phthalocyanine (SnPc-PFAE$_M$).

<Example 7> Synthesis of Perfluoroalkyl Ether(L) Substituted Zinc-Phthalocyanine (ZnPc-PFAE$_L$)

0.60 g of PN-PFAE$_L$ (1.04 mmol), 0.05 g of zinc acetate (0.26 mmol), 0.02 g of DBU (0.10 mmol), and 6 cm³ of n-pentanol were added into a 50 cm³ round flask and refluxed for about 24 hours. After being cooled to ambient temperature, a precipitated product was filtered and obtained and then refluxed in methanol for about 1 hour. A solid obtained after filtration was reflexed in hexane for about 1 hour and then filtered. After being dried in vacuum, 0.7 g of ZnPc-PFAE$_L$ was obtained as a final product (0.8 g, yield: 38%). UV-Vis (THF): $\lambda_{max}$ (nm) (log F) 656. IR [(KBR): $\nu_{max}$, (cm⁻¹)] 3140, 2930, 2590, 2360, 1720, 1610, 1480, 1400, 1310, 1240, 1190, 1120, 989.

Chemical equation 7 below shows a synthesis chemical equation of perfluoroalkyl ether(L) substituted zinc-phthalocyanine (ZnPc-PFAE$_L$).

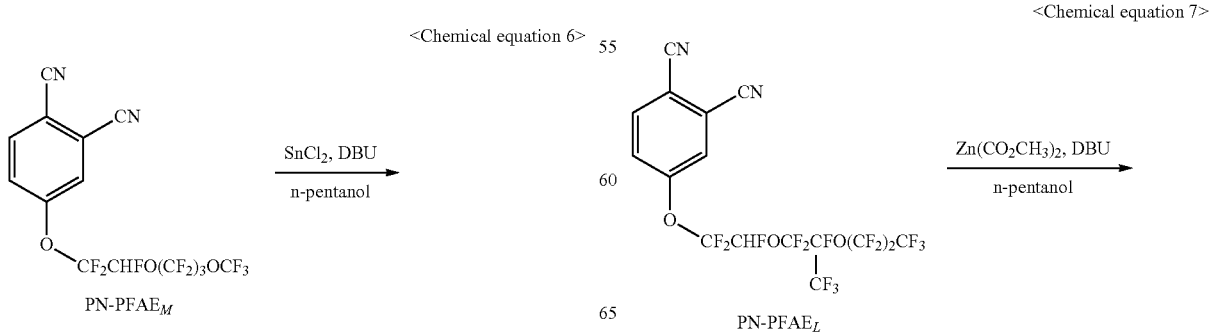

<Chemical equation 6>

<Chemical equation 7>

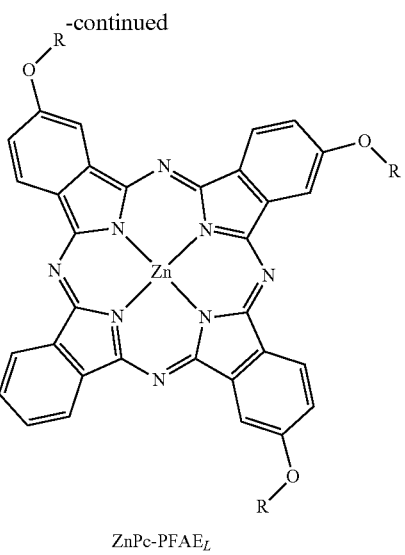

ZnPc-PFAE$_L$

R: —CF$_2$CHFOCF$_2$CFO(CF$_2$)$_2$CF$_3$
      |
      CF$_3$

<Example 8> Synthesis of Fluorinated Tin-Oxo Cluster Material

A fluoro-tin-oxo cluster material was synthesized using the following method including four operations.

First Operation: Synthesis of a Perfluoroalkyl-Substituted Tin Compound pH$_2$Sn—R$_f$(6.2)

0.42 g (17.45 mmol) of magnesium turnings, 6.89 g (14.54 mmol) of 1H,1H,2H,2H-tridecafluoro-n-octyl iodide, and 20 cm$^3$ of diethyl ether were put into a 100 cm$^3$ 1-neck round flask at a temperature of about 0° C. The reaction solution was stirred at ambient temperature for about 3 hours, and a solution prepared by dissolving 2.0 g (5.82 mmol) of diphenyl tin dichloride in 20 ml of THF was then added. The solution was reacted at ambient temperature for about 24 hours, and 60 ml of water was added to terminate the reaction. A product was filtered using celite, dissolved in hexane, and concentrated. The solution obtained by concentration under reduced pressure was purified using a chromatography (silica gel, hexane) method to obtain liquid Ph$_2$Sn—R$_f$(6.2) (3.0 g yield: 53%).

$^1$H NMR (400 MHz, CDCl$_3$, ppm): δ=7.40-7.56 (m, 10H), 2.22-2.48 (m, 4H), 1.38-1.58 (m, 4H)

Chemical equation 8-1 below shows a chemical equation of the synthesis of a perfluoroalkyl-substituted tin compound Ph$_2$Sn—R$_f$(6.2).

<Chemical equation 8-1>

Second Operation: Synthesis of Perfluoroalkyl-Chain-Substituted Tin Compound Cl$_2$Sn—R$_f$(6.2)

3.0 g (3.10 mmol) of Ph$_2$Sn—R$_f$(6.2), 0.78 g (7.13 mmol) of trimethylsilyl chloride (TMSCl), 0.50 g (15.51 mmol) of dry methanol (MeOH), and 10 ml of perchloro methane (CCl$_4$) were put into a 100 cm$^3$ 1-neck round flask at a temperature of about 0° C. The reaction solution was stirred at ambient temperature for about 12 hours, and a solid obtained by concentration under reduced pressure was dissolved in hexane and recrystallized to obtain white solid Cl$_2$Sn—R$_f$(6.2) (2.5 g yield: 91%).

$^1$H NMR (400 MHz, CDCl$_3$, ppm): δ=2.42-2.83 (m, 4H), 1.87-2.07 (m, 4H)

Chemical equation 8-2 shows a chemical equation of the synthesis of a perfluoroalkyl-chain-substituted tin compound Cl$_2$Sn—R$_f$(6.2).

<Chemical equation 8-2>

Third Operation: Synthesis of Perfluoroalkyl-Chain-Substituted Tin Oxide [R$_f$(6.2)SnO]n 2.5 g (2.83 mmol) of Cl$_2$Sn—R$_f$(6.2), and a 4 M (2.12 ml) sodium hydroxide solution in 20 ml of THF were put into a 100 cm$^3$ 1-neck round flask at a temperature of about 0° C. The reaction solution was stirred at ambient temperature for about 12 hours, and a solid obtained by concentration under reduced pressure was washed with 50 ml of methylene chloride (MC) and 50 ml of water and dried several times to obtain white solid [R$_f$(6.2)SnO]n (1.3 g yield: 55%).

Chemical equation 8-3 below shows a chemical equation of the synthesis of perfluoroalkyl-substituted tin oxide [R$_f$(6.2)SnO]n.

<Chemical equation 8-3>

Fourth Operation: Synthesis of a Perfluoroalkyl-Chain-Substituted Tin Oxide [Cl{R$_f$(6.2)}$_2$SnOSn{R$_f$(6.2)}$_2$Cl]$_2$ 1.3 g (1.57 mmol) of [R$_f$(6.2)SnO]n was dispersed in a 4 M (0.51 ml) solution of hydrochloric acid in 20 ml of acetone, and was put into a 100 cm$^3$ 1-neck round flask at ambient temperature. The reaction solution was stirred at ambient temperature for about 24 hours, and the reactant was then diluted with 50 ml of perfluorohexane (FC-72) and washed with 50 ml of MC and 50 ml of water. Residual moisture was removed using magnesium persulfate (MgSO$_4$), and a solid obtained by concentration under reduced pressure was recrystallized into methylene chloride to obtain a white solid final material (0.7 g, yield: 52%).

$^1$H NMR (400 MHz, (CD$_3$)$_2$CO, ppm): δ=2.54-2.76 (m, 16H), 1.57-1.94 (m, 16H)

Chemical equation 8-4 below shows a chemical equation of the synthesis of a perfluoroalkyl-chain-substituted tin oxide [Cl{R$_f$(6.2)}$_2$SnOSn{R$_f$(6.2)}$_2$Cl]$_2$.

<Chemical equation 8-4>

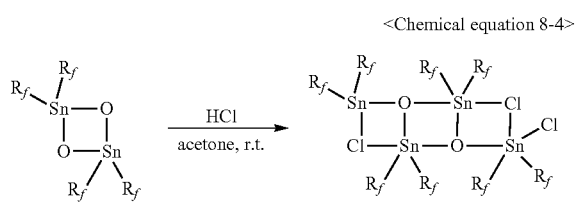

<Example 9> E-Beam Lithography—Application of SnPc-PFAE$_L$

A solution (5 wt/vol %) of SnPc-PFAE$_L$ synthesized in Example 5, which was dissolved in PF-7600 (3M), was spin-coated on a silicon substrate at a rate of about 3,000 rpm for about 60 seconds and heated at a temperature of about 110° C. for about 1 minute to form a thin film having a thickness of about 100 nm. Subsequently, e-beams were irradiated at a dose of about 50 μC/cm$^2$ to about 1,500 μC/cm$^2$ at an acceleration voltage of about 80 keV, and a developing process was performed using HFE-7100, which was a highly-fluorine-based solvent, for about 20 seconds to form negative-type resist patterns having linewidths of about 70 nm and about 100 nm.

FIG. 1 shows images of a negative-type resist pattern of SnPc-PFAE$_L$ resist, which was formed by performing an e-beam lithography process according to Example 9.

<Example 10> E-Beam Lithography—Application of SnPc-PFAE$_M$

A solution (5 wt/vol %) of SnPc-PFAE$_M$ synthesized in Example 6, which was dissolved in PF-7600 (3M), was spin-coated on a silicon substrate at a rate of about 3,000 rpm for about 60 seconds and heated at a temperature of about 110° C. for about 1 minute to form a thin film having a thickness of about 100 nm. Subsequently, e-beams were irradiated at a dose of about 50 μC/cm$^2$ to about 1,500 μC/cm$^2$ at an acceleration voltage of about 80 keV, and a developing process was performed using PF-7600 for about 30 seconds to form negative-type resist patterns having linewidths of about 50 nm and about 100 nm.

Figure 2:
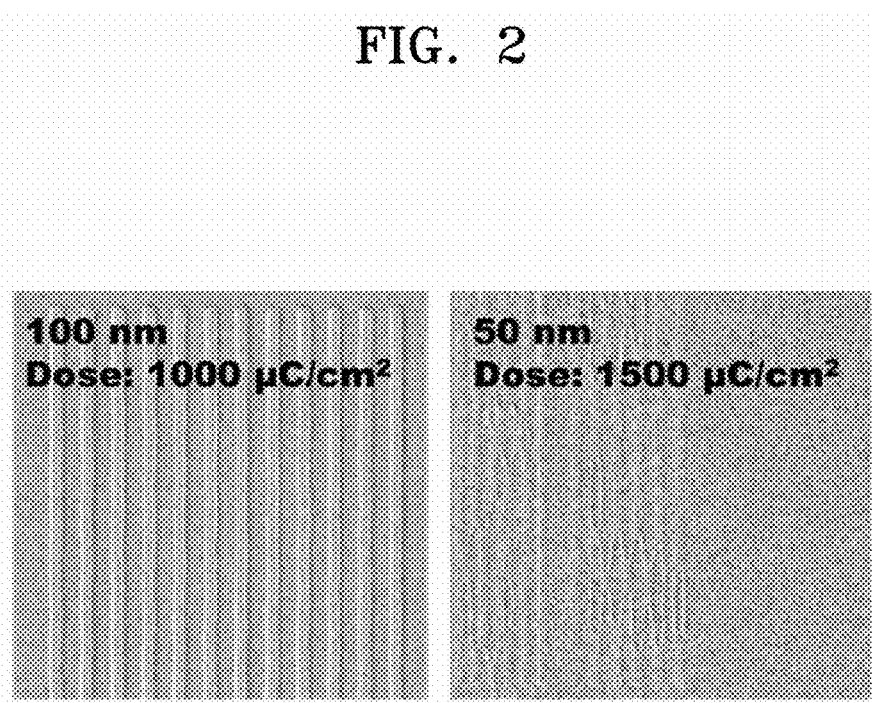
FIG. 2 shows images of a negative-type resist pattern of SnPc-PFAE$_M$ resist, which was formed by performing an e-beam lithography process according to Example 10.

FIG. 2 shows images of a negative-type resist pattern of SnPc-PFAE$_M$ resist, which was formed by performing an e-beam lithography process according to Example 10.

<Example 11> E-Beam Lithography—Application of ZnPc-PFAE$_L$

A solution (5 wt/vol %) of ZnPc-PFAE$_L$ synthesized in Example 7, which was dissolved in PF-7600 (3M), was spin-coated on a silicon substrate at a rate of about 3,000 rpm for about 60 seconds and heated at a temperature of about 110° C. for about 1 minute to form a thin film having a thickness of about 100 nm. Subsequently, e-beams were irradiated at a dose of about 50 μC/cm$^2$ to about 1,500 μC/cm$^2$ at an acceleration voltage of about 80 keV, and a developing process was performed using PF-7600 for about 10 seconds to form negative-type resist patterns having linewidths of about 70 nm and about 100 nm.

Figure 3:
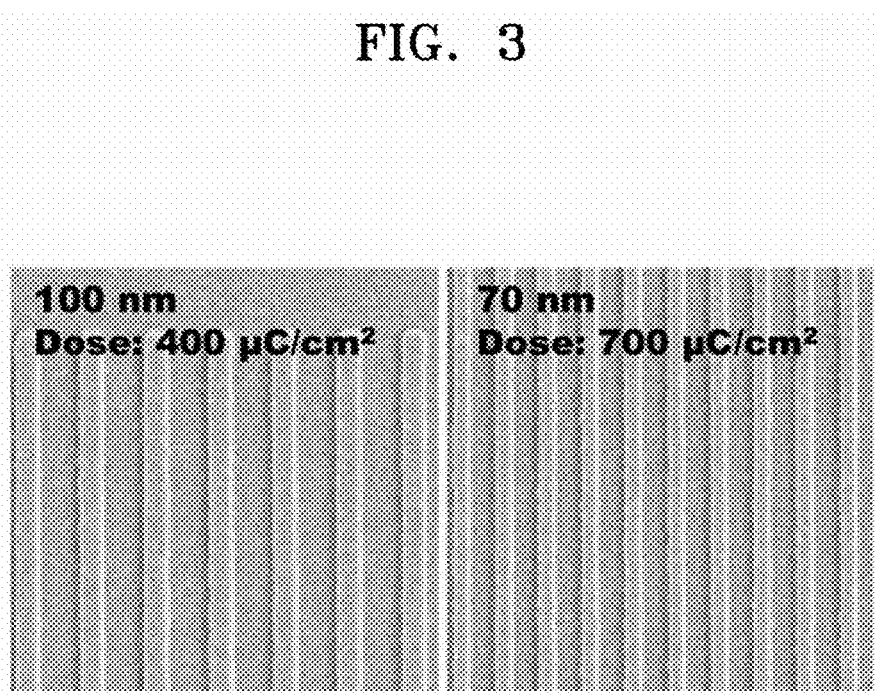
FIG. 3 shows images of a negative-type resist pattern of ZnPc-PFAE$_L$ resist, which was formed by performing an e-beam lithography process according to Example 11.

FIG. 3 shows images of a negative-type resist pattern of ZnPc-PFAE$_L$ resist, which was formed by performing an e-beam lithography process according to Example 11.

<Example 12> Formation of Patterns Via EUV Irradiation—Application of SnPc-PFAE$_L$ A solution (2 wt/vol %) of SnPc-PFAE$_L$ synthesized in Example 5, which was dissolved in PF-7600, was spin-coated on a silicon substrate at a rate of about 3,000 rpm for about 60 seconds and heated at a temperature of about 110° C. for about 1 minute to form a thin film having a thickness of about 35 nm. Thereafter, EUV light extracted from a radiation accelerator was irradiated, and a developing process was then performed using HFE-7100 for about 20 seconds. The formation of a negative pattern with reduced solubility was confirmed at an exposure dose (sensitivity) of about 10 mJ/cm$^2$ to about 200 mJ/cm$^2$.

Figure 4:
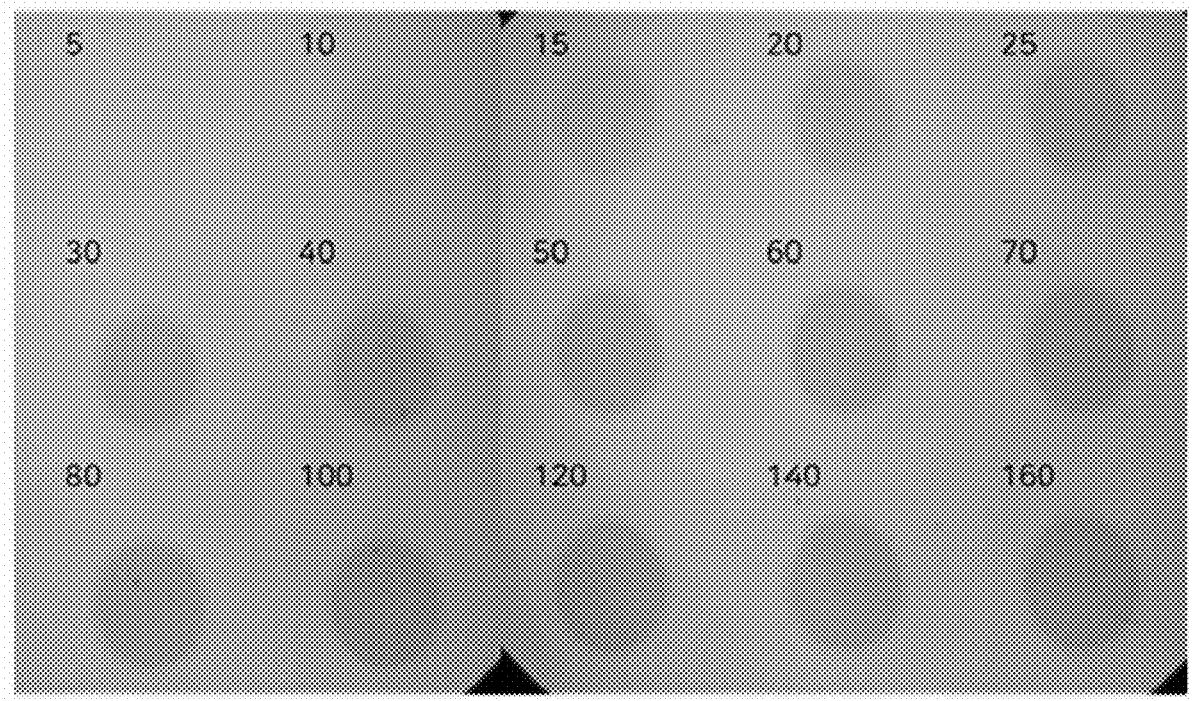
FIG. 4 shows images of a negative-type resist pattern of SnPc-PFAE$_L$ resist, which was formed by performing an extreme ultraviolet (EUV) exposure process according to Example 12.

FIG. 4 shows images of a negative-type resist pattern of SnPc-PFAE$_L$ resist, which was formed by performing an EUV exposure process according to Example 12.

<Example 13> Formation of Patterns Via EUV Irradiation Application of SnPc-PFAE$_M$ A solution (2 wt/vol %) of SnPc-PFAE$_M$ synthesized in Example 6, which was dissolved in PF-7600, was spin-coated on a silicon substrate at a rate of about 3,000 rpm for about 60 seconds and heated at a temperature of about 110° C. for about 1 minute to form a thin film having a thickness of about 40 nm. Thereafter, EUV light extracted from a radiation accelerator was irradiated, and a developing process was then performed using PF-7600 for about 30 seconds. The formation of a negative pattern with reduced solubility was confirmed at an exposure dose (sensitivity) of about 10 mJ/cm$^2$ to about 200 mJ/cm$^2$.

Figure 5:
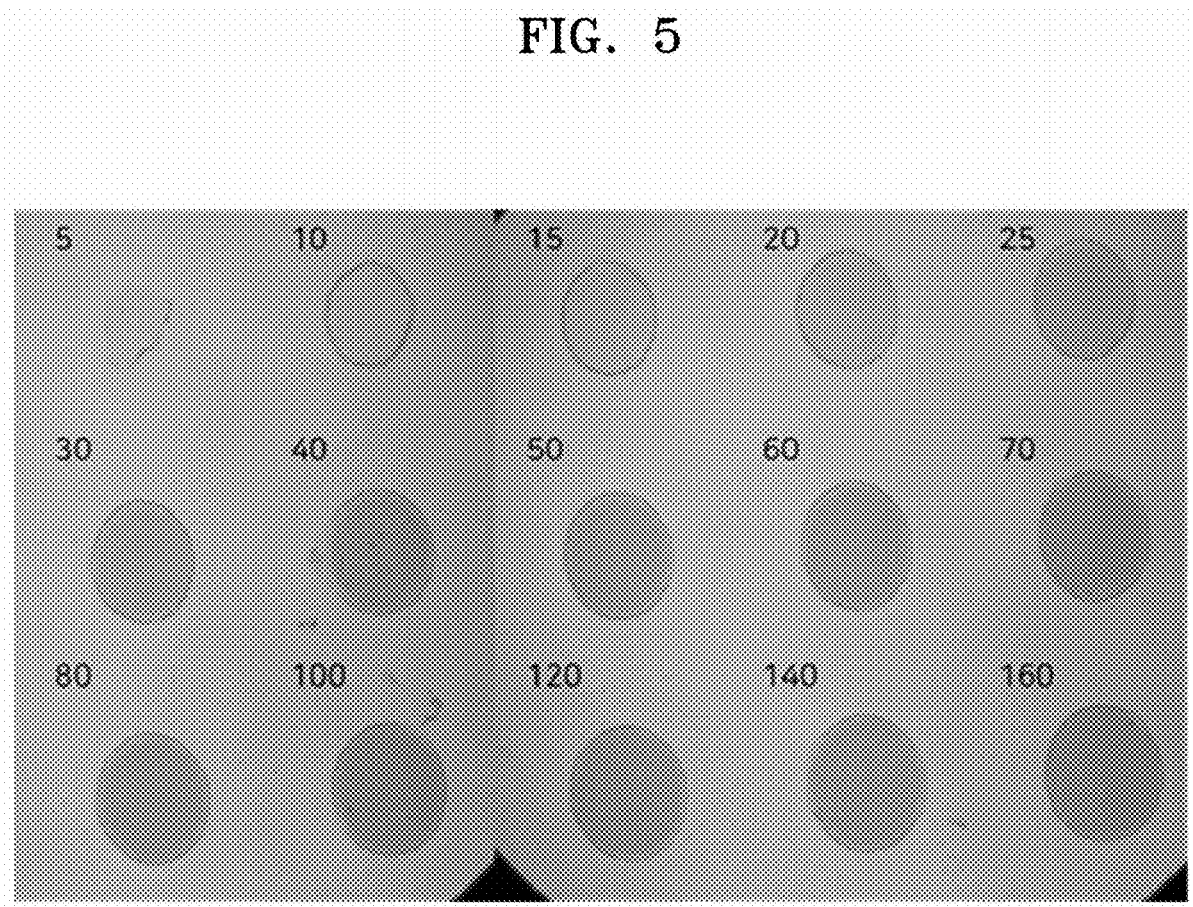
FIG. 5 shows images of a negative-type resist pattern of SnPc-PFAE$_L$ resist, which was formed by performing an EUV exposure process according to Example 13.

FIG. 5 shows images of a negative-type resist pattern of SnPc-PFAE$_L$ resist, which was formed by performing an EUV exposure process according to Example 13.

<Example 14> Formation of Patterns Via EUV Irradiation—Application of ZnPc-PFAE$_L$ A solution (2 wt/vol %) of ZnPc-PFAE$_L$ synthesized in Example 7, which was dissolved in PF-7600, was spin-coated on a silicon substrate at a rate of about 3,000 rpm for about 60 seconds and heated at a temperature of about 110° C. for about 1 minute to form a thin film having a thickness of about 40 nm. Thereafter, EUV light extracted from a radiation accelerator was irradiated, and a developing process was then performed using PF-7600 for about 20 seconds. The formation of a negative pattern with reduced solubility was confirmed at an exposure dose (sensitivity) of about 4 mJ/cm$^2$ to about 200 mJ/cm$^2$.

Figure 6:
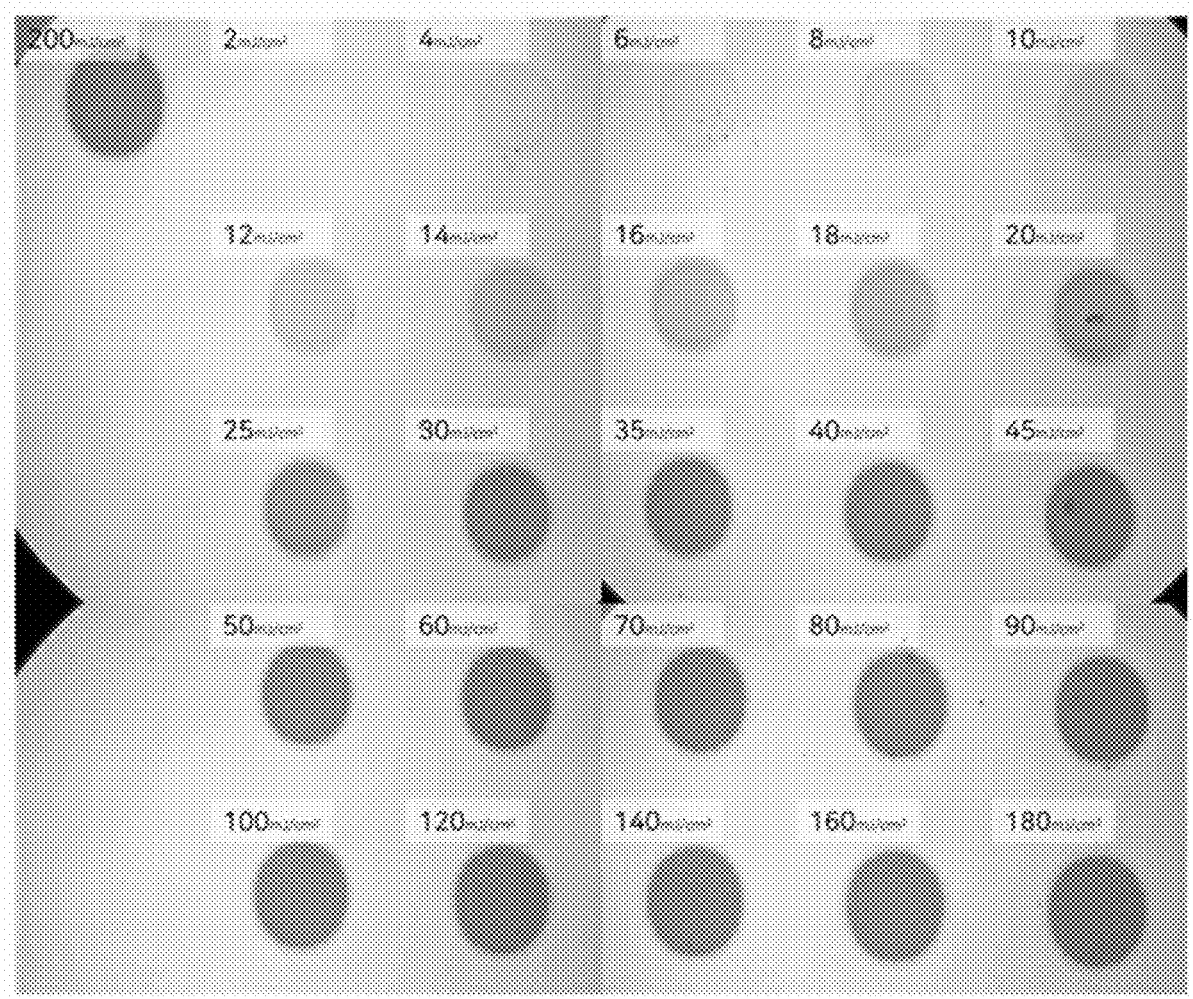
FIG. 6 shows images of a negative-type resist pattern of ZnPc-PFAE$_L$ resist, which was formed by performing an EUV exposure process according to Example 14.

FIG. 6 shows images of a negative-type resist pattern of ZnPc-PFAE$_L$ resist, which was formed by performing an EUV exposure process according to Example 14.

<Example 15> Formation of Patterns Via EUV Irradiation—Application of Fluoro-Tin-Oxo Cluster Compound A solution (2 wt/vol %) of fluoro-tin-oxo cluster compound synthesized in Example 8, which was dissolved in PF-7600, was spin-coated on a silicon substrate at a rate of about 3,000 rpm for about 60 seconds and heated at a temperature of about 110° C. for about 1 minute to form a thin film having a thickness of about 40 nm. Thereafter, EUV light extracted from a radiation accelerator was irradiated, and a developing process was then performed using PF-7600 for about 20 seconds. The formation of a negative pattern with reduced solubility was confirmed at an exposure dose (sensitivity) of about 10 mJ/cm$^2$ to about 200 mJ/cm$^2$.

Comparative Example 1

A negative pattern was formed in the same manner as in Example 12 except that a photoresist compound having a structure of Formula 5 below was synthesized and used instead of SnPc-PFAE$_L$ according to a manufacturing method disclosed in Korean Patent Publication No. 10-2020-0098784.

of a thickness of a photoresist thin film remaining after a development process with respect to an exposure dose.

TABLE 1

| Photoresist compound | | Light source | Sensitivity (mJ/cm$^2$) |
|---|---|---|---|
| Example 12 | SnPc-PFAE$_L$ | EUV | 25 |
| Example 13 | SnPc-PFAE$_M$ | EUV | 20 |
| Example 14 | ZnPc-PFAE$_L$ | EUV | 14 |
| Example 15 | Tin-oxo cluster compound | EUV | 20 |
| Comparative Example 1 | Formula 5 | EUV | 50 |

As shown in Table 1, it may be seen that photoresist materials containing crosslinking materials according to Examples 12 to 15 were patterned well even at a significantly lower exposure dose than a photoresist material according to Comparative Example 1. Accordingly, it can be seen that the photoresist materials containing the crosslinking materials according to Examples 12 to 15 had excellent sensitivities.

Comparative Example 2

A negative pattern was formed in the same manner as in Example 12 except that DJKP-3239 (Dongjin Semichem) was used instead of SnPc-PFAE$_L$.

<Example 16> Dry Etching Process for Estimating Etch Resistances

A solution (10 wt/vol %) obtained by dissolving each of photoresist materials according to Examples 5, 7, and 8 and

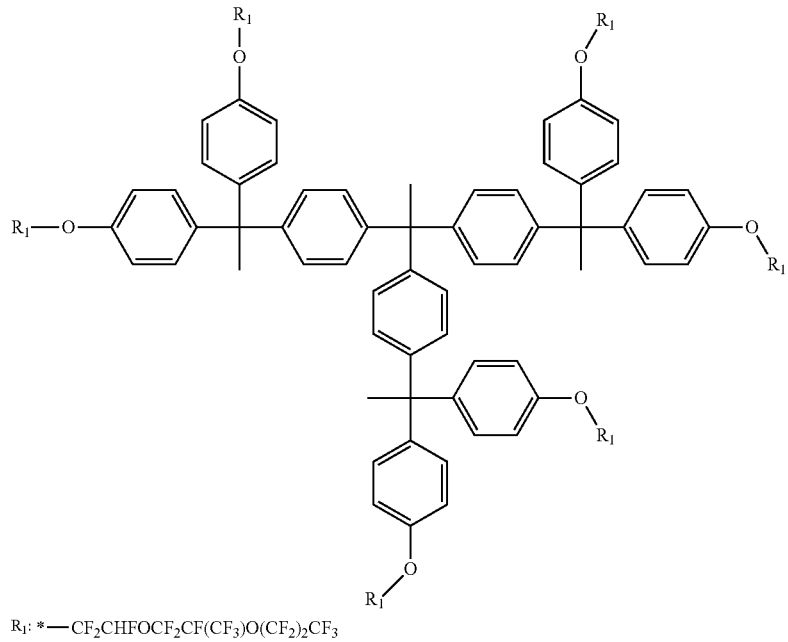

<Formula 5>

$R_1$: *—CF$_2$CHFOCF$_2$CF(CF$_3$)O(CF$_2$)$_2$CF$_3$

Table 1 shows sensitivities of Comparative Example 1 and Examples 12 to 15 in which an EUV exposure process is performed. In Table 1, an exposure dose at which the thickness of the photoresist thin film is halved was adopted as a sensitivity based on a contrast curve, which is a graph Comparative Examples 1 and 2 in PF-7600 was spin-coated on a silicon substrate at a rate of about 1,000 rpm for about 60 seconds. Thereafter, a thin film was formed to a thickness of about 300 nm to about 400 nm by performing a heating process at a temperature of about 110° C. for about 1 minute.

Afterwards, each resist thin film was etched for about 60 seconds to about 120 seconds. Pressure and power in an etching chamber were about 10 mTorr and RF 300 W, respectively, and $CF_4$ was solely used as an etching gas. More specifically, $CF_4$ gas was supplied at a flow rate of about 50 sccm. After the etching of the thin film was completed, an etch rate was calculated by analyzing a step difference of the etched thin film using a step measuring device (KLA-Tencor Alpha-Step D-500).

Figure 7:
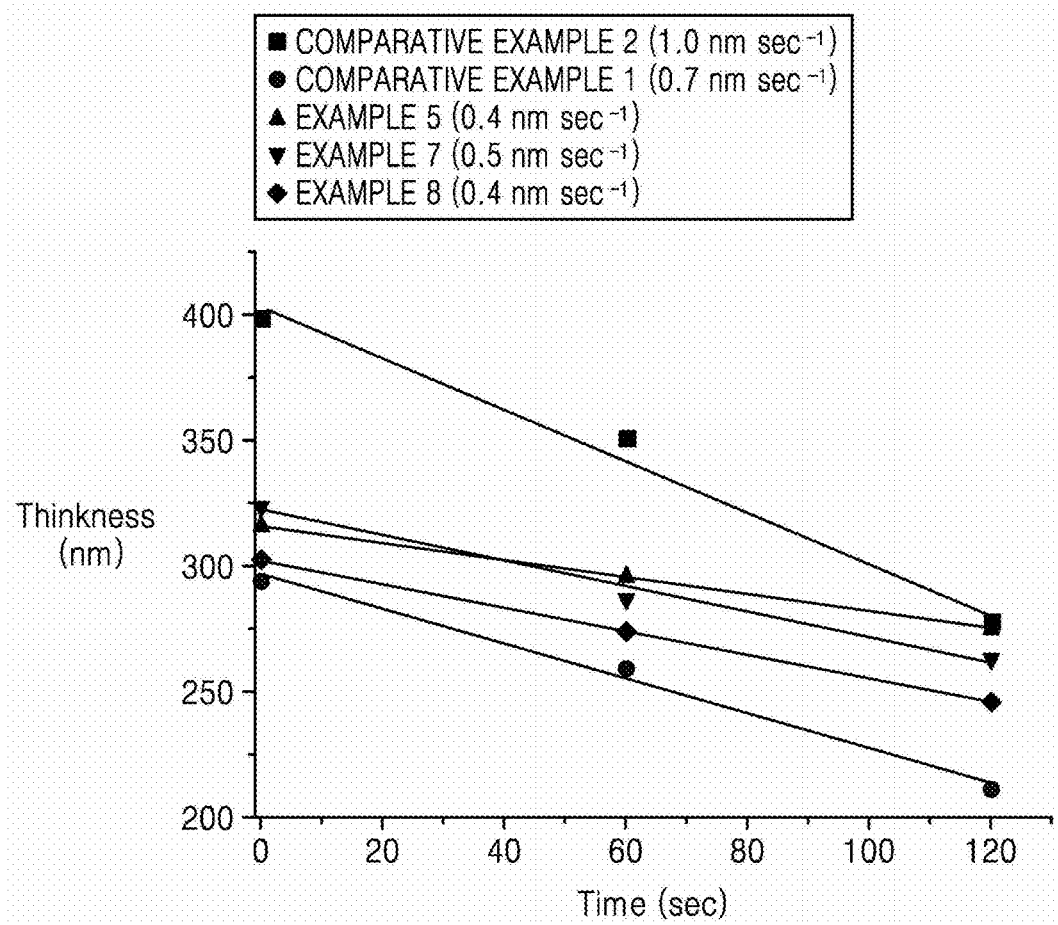
FIG. 7 is a graph showing results of a dry etch rate test performed on photoresist materials according to Comparative Examples 1 and 2 and Examples 5, 7, and 8.

FIG. 7 is a graph showing results of a dry etch rate test performed on photoresist materials according to Comparative examples 1 and 2 and Examples 5, 7, and 8.

Referring to FIG. 7, it was confirmed that etch rates of the photoresist materials according to Examples 5, 7, and 8 were much lower than those of the photoresist materials according to Comparative Examples 1 and 2. Thus, it may be seen that etch resistances of the photoresist materials according to Examples 5, 7, and 8 were higher than those of the photoresist materials according to Comparative Examples 1 and 2.

PR Composition

One aspect of an embodiment may provide a photoresist composition including a photoresist compound described above and a solvent.

The solvent included in the photoresist composition may include an organic solvent. In an implementation, the organic solvent may include, e.g., an ether, an alcohol, a glycolether, an aromatic hydrocarbon compound, a ketone, or an ester. In an implementation, the organic solvent may include, e.g., ethylene glycol monomethyl ether, ethylene glycol monoethyl ether, methyl cellosolve acetate, ethyl cellosolve acetate, diethylene glycol methyl ether, diethylene glycol ethyl ether, propylene glycol, propylene glycol methyl ether (PGME), propylene glycol methyl ether acetate (PGMEA), propylene glycol ethyl ether, propylene glycol ethyl ether acetate, propylene glycol propyl ether acetate, propylene glycol butyl ether, propylene glycol butyl ether acetate, ethanol, propanol, isopropyl alcohol, isobutyl alcohol, 4-methyl-2-pentanol (or methyl isobutyl carbinol (MIBC)), hexanol, 1-methoxy-2-propanol, 1-ethoxy-2-propanol, ethylene glycol, propylene glycol, heptanone, propylene carbonate, butylene carbonate, toluene, xylene, methylethylketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, gamma-butyrolactone, methyl 2-hydroxyisobutyrate, methoxybenzene, n-butyl acetate, 1-methoxy-2-propyl acetate, methoxyethoxy propionate, ethoxyethoxy propionate, or a combination thereof.

In the photoresist composition according to the embodiments, the solvent may be included in an amount of, e.g., about 20% to about 95% by weight, based on a total weight of the photoresist composition.

In an implementation, the photoresist composition may further include, e.g., a surfactant, a dispersant, a desiccant, or a coupling agent.

The surfactant may help improve the coating uniformity and wettability of the photoresist composition. In an implementation, the surfactant may include, e.g., sulfuric acid ester salts, sulfonates, phosphate ester, soap, amine salts, quaternary ammonium salts, polyethylene glycol, alkylphenol ethylene oxide adducts, polyhydric alcohol, a nitrogen-containing vinyl polymer, or a combination thereof. In an implementation, the surfactant may include, e.g., alkylbenzene sulfonates, alkylpyridinium salts, polyethylene glycol, or quaternary ammonium salts. When the photoresist composition includes the surfactant, the surfactant may be included in an amount of, e.g., about 0.001% to about 3% by weight, based on the total weight of the photoresist composition.

The dispersant may help uniformly disperse respective components in the photoresist composition. In an implementation, the dispersant may include, e.g., an epoxy resin, polyvinyl alcohol, polyvinyl butyral, polyvinylpyrrolidone, glucose, sodium dodecyl sulfate, sodium citrate, oleic acid, linoleic acid, or a combination thereof. When the photoresist composition includes the dispersant, the dispersant may be included in an amount of, e.g., about 0.001% to about 5% by weight, based on the total weight of the photoresist composition.

The desiccant may help prevent adverse effects due to moisture in the photoresist composition. In an implementation, the desiccant may help prevent a metal included in the photoresist composition from being oxidized due to moisture. In an implementation, the desiccant may include, e.g., polyoxyethylene nonylphenolether, polyethylene glycol, polypropylene glycol, polyacrylamide, or a combination thereof. When the photoresist composition includes the desiccant, the desiccant may be included in an amount of, e.g., about 0.001% to about 10% by weight, based on the total weight of the photoresist composition.

The coupling agent may help increase adhesion of the photoresist composition with a lower film when the lower film is coated with the photoresist composition. In an implementation, the coupling agent may include a silane coupling agent. In an implementation, the silane coupling agent may include, e.g., vinyl trimethoxysilane, vinyl triethoxysilane, vinyl trichlorosilane, vinyl tris(β-methoxyethoxy)silane, 3-methacryl oxypropyl trimethoxysilane, 3-acryl oxypropyl trimethoxysilane, p-styryl trimethoxysilane, 3-methacryl oxypropyl methyldimethoxysilane, 3-methacryl oxypropyl methyldiethoxysilane, or trimethoxy [3-(phenylamino)propyl]silane. When the photoresist composition includes the coupling agent, the coupling agent may be included in an amount of, e.g., about 0.001% to about 5% by weight, based on the total weight of the photoresist composition.

In the photoresist composition according to the embodiments, when the solvent includes only the organic solvent, the photoresist composition may further include water. In this case, water may be included in an amount of, e.g., about 0.001% to about 0.1% by weight, in the photoresist composition.

The photoresist composition according to the embodiments may not include (e.g., may be free of or essentially free of) a photoacid generator (PAG), e.g., an acid generator configured to generate acids due to exposure (e.g., to light).

Manufacture of an Integrated Circuit (IC) Device

Next, a method of manufacturing an IC device using the photoresist composition according to the embodiment will be described with reference to a specific example.

Figure 8:
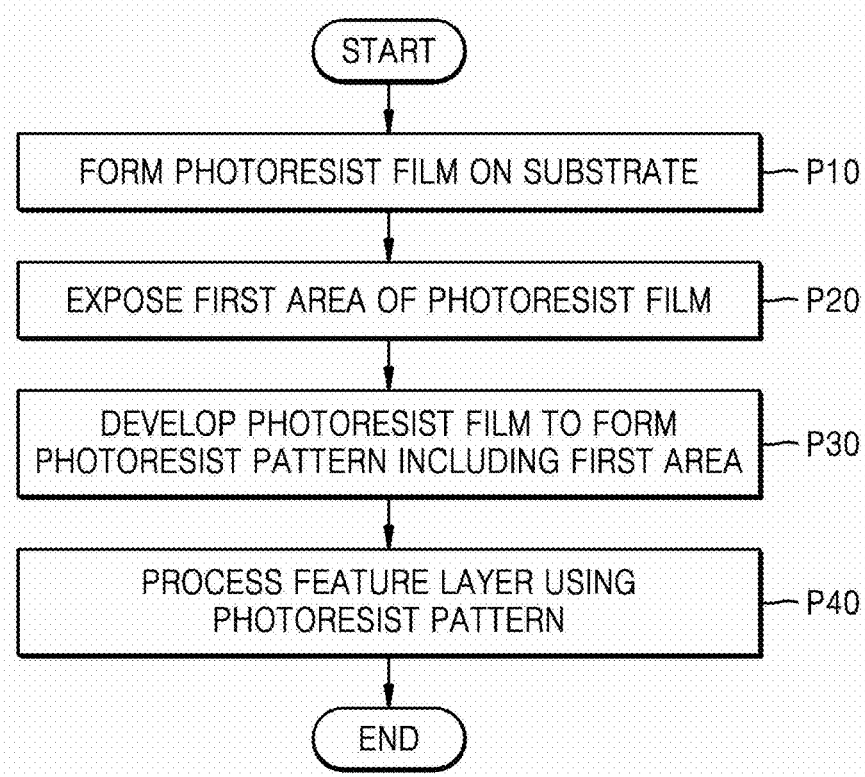
FIG. 8 is a flowchart of a method of manufacturing an integrated circuit (IC) device according to an embodiment.

FIG. 8 is a flowchart of a method of manufacturing an IC device, according to embodiments. FIGS. 9A to 9E are cross-sectional views of a process sequence of a method of manufacturing an IC device, according to embodiments.

Figure 9A:
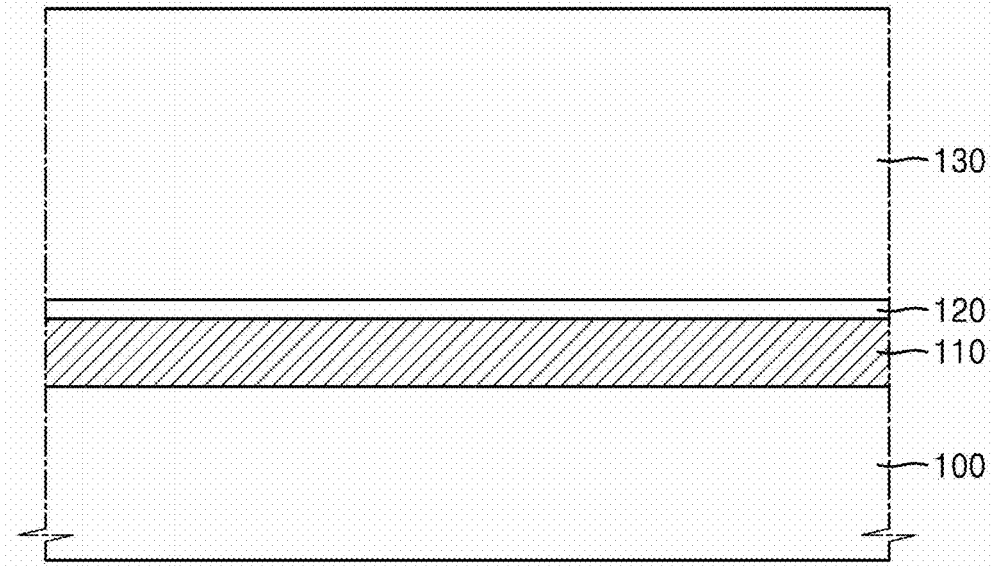
FIGS. 9A to 9E are cross-sectional views of stages in a method of manufacturing an IC device according to an embodiment.

Referring to FIGS. 8 and 9A, in process P10, a photoresist film 130 may be formed on a lower film using a photoresist material according to an embodiment. The lower film may include a substrate 100 and a feature layer 110 on the substrate 100.

The photoresist film 130 may include a crosslinking molecule, e.g., a component of a photoresist composition according to an embodiment, and a solvent. A detailed configuration of the photoresist composition may be as described above. In an implementation, the photoresist composition may not include a PAG.

The substrate 100 may include a semiconductor substrate. The feature layer 110 may include an insulating film, a conductive film, or a semiconductor film. In an implementation, the feature layer 110 may include, e.g., a metal, an alloy, a metal carbide, a metal nitride, a metal oxynitride, a metal oxycarbide, a semiconductor, polysilicon, oxide, nitride, oxynitride, or a combination thereof.

In an implementation, as shown in FIG. 9A, before the photoresist film 130 is formed on the feature layer 110, a lower film 120 may be formed on the feature layer 110. In this case, the photoresist film 130 may be formed on the lower film 120. The lower film 120 may help prevent the photoresist film 130 from receiving adverse effects from the feature layer 110 located thereunder. In an implementation, the lower film 120 may include, e.g., an organic or inorganic anti-reflective coating (ARC) material for a krypton fluoride (KrF) excimer laser, an argon fluoride (ArF) excimer laser, an EUV laser, or any other light source. In an implementation, the lower film 120 may include, e.g., a bottom anti-reflective coating (BARC) film or a developable bottom anti-reflective coating (DBARC) film. In an implementation, the lower film 120 may include, e.g., an organic component having a light-absorbing structure. The light-absorbing structure may include, e.g., a benzene ring or a hydrocarbon compound in which benzene rings are fused. In an implementation, the lower film 120 may be formed to a thickness of, e.g., about 1 nm to about 100 nm. In an implementation, the lower film 120 may be omitted.

To form the photoresist film 130, a photoresist composition according to an embodiment may be coated on the lower film 120, and then annealed. The coating process may be performed using a suitable method, e.g., a spin coating process, a spray coating process, and a deep coating process. In an implementation, the process of annealing the photoresist composition may be performed, e.g., at a temperature of about 80° C. to about 300° C. for about 10 seconds to about 100 seconds. A thickness of the photoresist film 130 may be several tens of times to several hundred times a thickness of the lower film 120. In an implementation, the photoresist film 130 may be formed to a thickness of, e.g., about 10 nm to about 1 m.

Figure 9B:
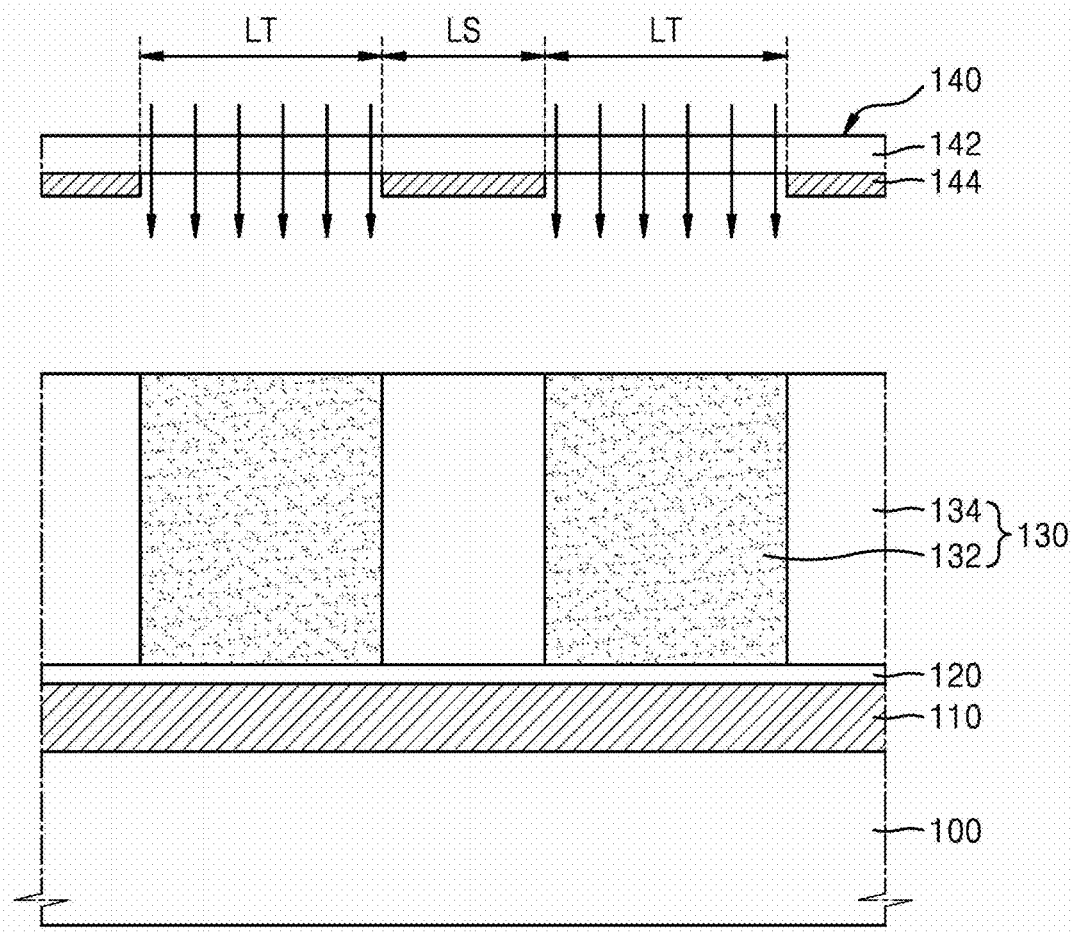

Referring to FIGS. 8 and 9B, in process P20, a first area 132, which is a portion of the photoresist film 130, may be exposed. Thus, perfluoro moieties of the crosslinking molecule may be crosslinked in the first area 132 to form a macromolecule, which is difficult to be removed using a developer. Without being bound by theory, one mechanism by which perfluoro moieties are crosslinked is described in detail in R. D. Chambers, Fluorine in Organic Chemistry, CRC Press, 2004, p. 164.

Crosslinking molecules of the first area 132, which is exposed, may be combined with each other to form a macromolecule, while crosslinking molecules of a second area 134, which is not exposed, may not be combined or bonded with each other. Accordingly, there may be a difference in solubility between crosslinked macromolecules and non-crosslinked crosslinking molecules. In an implementation, the photoresist film 130 may not include a PAG, and resolution degradation, which could otherwise occur due to the diffusion of acid during a post-exposure bake (PEB) process, may be prevented.

In an implementation, to expose the first area 132 of the photoresist film 130, a photomask 140 having a plurality of light-shielding areas LS and a plurality of light-transmitting areas LT may be arranged at a predetermined position on the photoresist film 130, and the first area 132 of the photoresist film 130 may be exposed through the plurality of light-transmitting areas LT of the photomask 140. The first area 132 of the photoresist film 130 may be exposed using a KrF excimer laser (248 nm), an ArF excimer laser (193 nm), a fluorine ($F_2$) excimer laser (157 nm), or an EUV laser (13.5 nm). In an implementation, a reflective photomask may be used instead of a transmissive photomask according to a type of light source. In an implementation, the transmissive photomask may be used, or another suitable exposure process may be performed by an equivalent configuration using the reflective photomask.

The photomask 140 may include a transparent substrate 142 and a plurality of light-shielding patterns 144 on the transparent substrate 142 in the plurality of light-shielding areas LS. The transparent substrate 142 may include quartz. The plurality of light-shielding patterns 144 may include chromium (Cr). The plurality of light-transmitting areas LT may be defined by the plurality of light-shielding patterns 144. In an implementation, a reflective photomask for an EUV exposure process may be used instead of the photomask 140 to expose the first area 132 of the photoresist film 130.

In process P20 of FIG. 8, after the first area 132 of the photoresist film 130 is exposed, the photoresist film 130 may be annealed. In an implementation, the annealing process may be performed, e.g., at a temperature of about 50° C. to about 400° C. for about 10 seconds to about 100 seconds. In an implementation, a degree of networking between crosslinking molecules in the first area 132 may be further increased during the annealing of the photoresist film 130. Accordingly, a difference in solubility in the developer between the first area 132 of the photoresist film 130, which is exposed, and the second area 134 of the photoresist film 130, which is not exposed, may be further increased, and pattern collapse may be prevented.

Figure 9C:
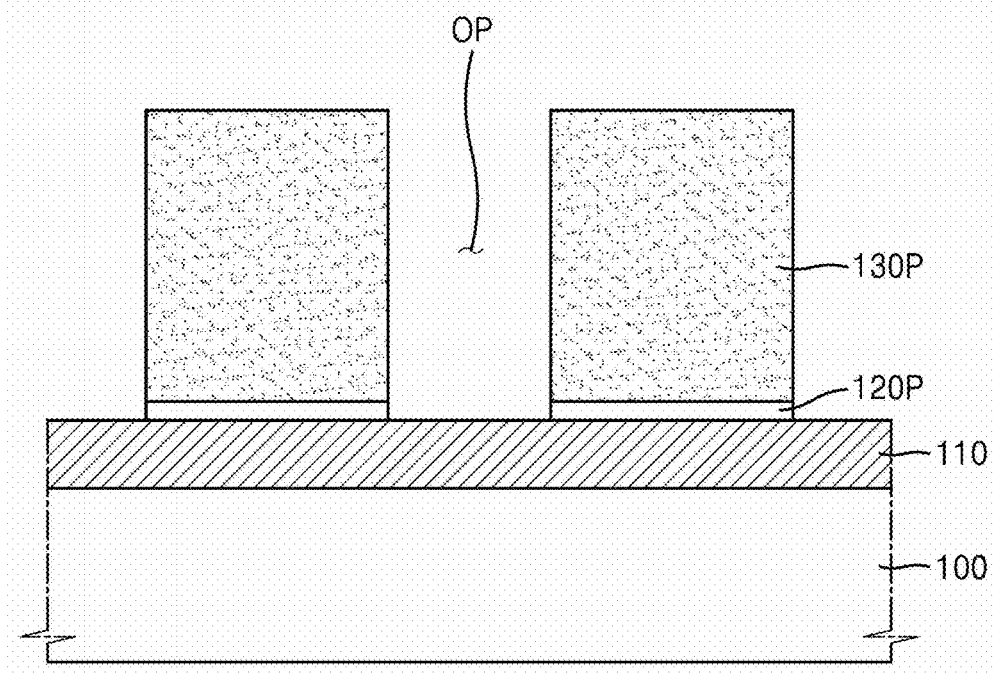

Referring to FIGS. 8 and 9C, in process P30, the photoresist film 130 may be developed using a developer to remove the second area 134 of the photoresist film 130. As a result, a photoresist pattern 130P (including remaining portions of the first area 132 of the photoresist film 130, which has been exposed) may be formed.

The photoresist pattern 130P may include a plurality of openings OP. After the photoresist pattern 130P is formed, portions of the lower film 120, which are exposed through the plurality of openings OP, may be removed to form a lower pattern 120P.

In an implementation, the developing of the photoresist film 130 may be performed using a negative-tone development (NTD) process. In an implementation, normal-butyl acetate (or n-butyl acetate) or 2-heptanone may be used as the developer.

As described above with reference to FIG. 9B, a difference in solubility in the developer between the first area 132 of the photoresist film 130, which is exposed, and the second area 134 of the photoresist film 130, which is not exposed, may be increased. Thus, the first area 132 may not be removed but remain as it is while the second area 134 is removed by developing the photoresist film 130 during the process of FIG. 9C. Accordingly, after the photoresist film 130 is developed, residue defects, such as a footing phenomenon, may not occur, and the photoresist pattern 130P may obtain a vertical sidewall profile. As described above, by improving a profile of the photoresist pattern 130P, when the feature layer 110 is processed using the photoresist pattern 130P, a critical dimension (CD) of an intended processing region may be precisely controlled in the feature layer 110.

Figure 9D:
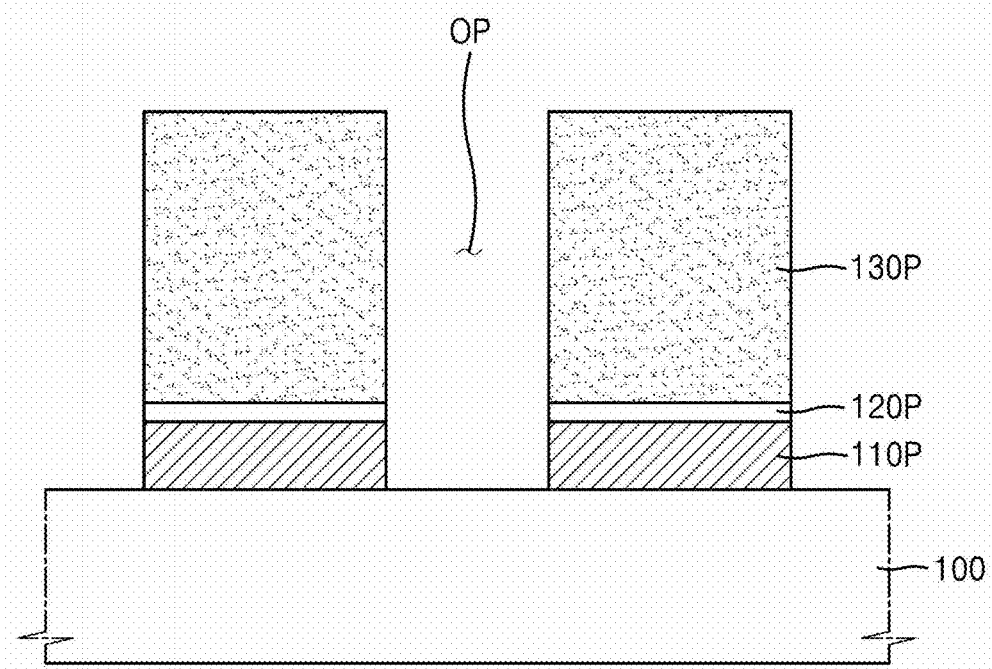

Referring to FIGS. 8 and 9D, in process P40, the feature layer 110 may be processed using the photoresist pattern 130P in the resultant structure of FIG. 9C.

To process the feature layer 110, various processes, e.g., a process of etching the feature layer 110 exposed by the openings OP of the photoresist pattern 130P, a process of implanting impurity ions into the feature layer 110, a process of forming an additional film on the feature layer 110 through the openings OP, and/or a process of modifying portions of the feature layer 110 through the openings OP, may be performed. FIG. 9D illustrates a process of forming a feature pattern 110P by etching the feature layer 110, which is exposed by the openings OP, as an example of processing the feature layer 110.

In an implementation, the process of forming the feature layer 110 may be omitted from the process described with reference to FIG. 9A. In this case, the substrate 100 may be processed using the photoresist pattern 130P instead of the process described with reference to the process P40 of FIG. 8 and FIG. 9D. In an implementation, various processes, such as a process of etching a portion of the substrate 100 using the photoresist pattern 130P, a process of implanting impurity ions into a partial region of the substrate 100, a process of forming an additional film on the substrate 100 through the openings OP, or a process of modifying portions of the substrate 100 through the openings OP, may be performed.

Figure 9E:
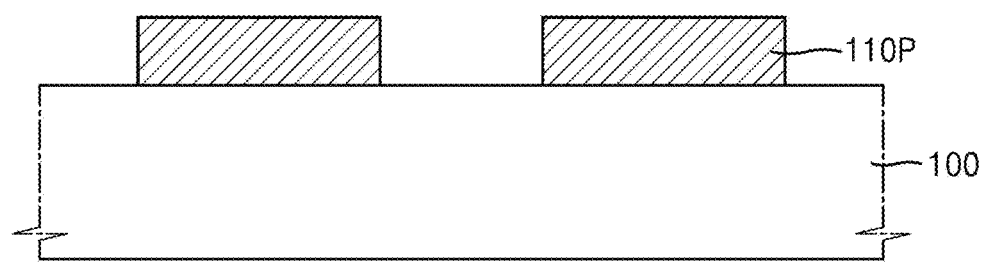

Referring to FIG. 9E, the photoresist pattern 130P and the lower pattern 120P, which remain on the feature pattern 110P, may be removed from the resultant structure of FIG. 9D. The photoresist pattern 130P and the lower pattern 120P may be removed using an ashing process and a strip process.

In the method of manufacturing an IC device according to the embodiments described with reference to FIGS. 8 and 9A to 9E, pattern collapse may be prevented during the formation of a photoresist pattern, and the photoresist pattern may be formed with a high resolution. In addition, the etch resistance of the formed photoresist pattern may be greatly improved. As a result, a hyperfine pattern may be obtained using a single lithography process instead of an LELE process, and when a subsequent process is performed on the feature layer 110 and/or the substrate 100 using the photoresist pattern 130P, a dimensional precision may be improved by precisely controlling critical dimensions (CDs) of processing regions or patterns to be formed in the feature layer 110 and/or the substrate 100. Furthermore, a CD distribution of patterns to be formed on the substrate 100 may be uniformly controlled, and the productivity of a process of manufacturing an IC device may be increased.

By way of summation and review, a photoresist material may have a solubility that is effectively changed by light irradiation and may form a hyperfine pattern without pattern collapse when developed using an appropriate solvent.

One or more embodiments may provide a method of manufacturing a semiconductor device, which may help prevent pattern collapse, form a hyperfine pattern of which etch resistance, sensitivity, and resolution are greatly improved, and manufacture a semiconductor device having an excellent critical dimension (CD) distribution at low cost.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:

forming a photoresist material layer on a lower film, the photoresist material layer including a crosslinking molecule having a molecular weight of 1,000 to 4,000;

exposing a partial region of the photoresist material layer;

removing an unexposed portion of the photoresist material layer to form a photoresist pattern; and processing the lower film using the photoresist pattern, wherein the crosslinking molecule includes a perfluoro alkyl moiety, the perfluoro alkyl moiety including a carbon-fluorine bond that dissociates in response to the exposing of the partial region of the photoresist material layer, wherein the photoresist material layer is free of photoacid generator.

2. The method as claimed in claim 1, wherein:

the crosslinking molecule includes a compound represented by Formula 1, Formula 2, or Formula 3,

[Formula 1]

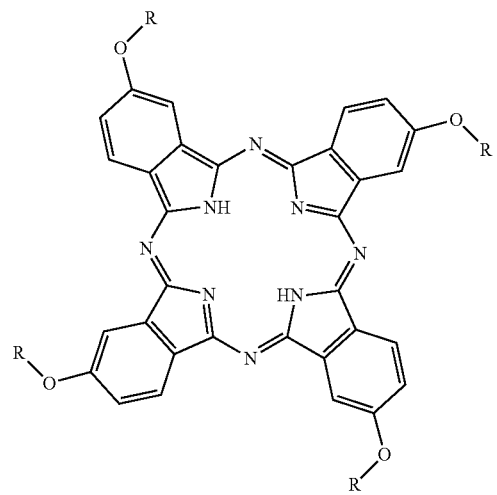

-continued

[Formula 2]

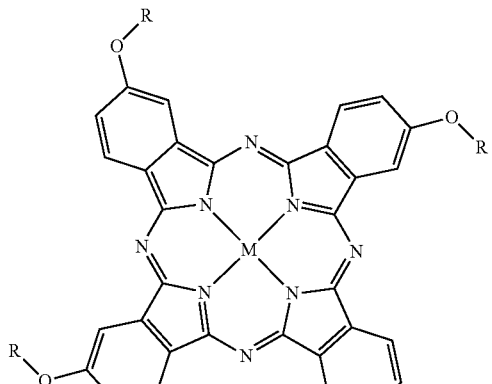

[Formula 3]

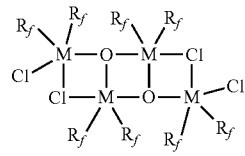

in Formulae 1 to 3,
M is tin (Sn), zinc (Zn), lithium (Li), sodium (Na), potassium (K), beryllium (Be), magnesium (Mg), calcium (Ca), barium (Ba), aluminum (Al), silicon (Si), cadmium (Cd), mercury (Hg), chromium (Cr), iron (Fe), cobalt (Co), nickel (Ni), copper (Cu), germanium (Ge), palladium (Pd), platinum (Pt), lead (Pb), strontium (Sr), or manganese (Mn), and
R and $R_f$ are each independently —$C_aF_bH_c(N,P)_d(S,O)_e$, in which a is an integer of 1 to 20, d and e are each independently an integer of 0 to 5, c is an integer of 0 to 20, b≥(a+c), and (b+c)=2a+2+d.

3. The method as claimed in claim 2, wherein:
the crosslinking molecule is represented by Formula 1, and
R is —$C_aF_bH_c(S,O)_e$, in which a is an integer of 5 to 10, e is an integer of 1 or 2 and c is an integer of 0 to 2.

4. The method as claimed in claim 2, wherein
the crosslinking molecule is represented by Formula 2,
M is tin (Sn) or zinc (Zn),
R is —$C_aF_bH_c(S,O)_e$, in which a is an integer of 5 to 10, e is an integer of 1 or 2, and c is an integer of 0 to 2.

5. The method as claimed in claim 4, wherein:
R is —$CF_2CHF$—O—R', and
R' is —$C_3F_7$, —$C_3OF_7$, —$C_4F_9$, —$C_4OF_9$, —$C_5F_{11}$, —$C_5OF_{11}$, —$C_6F_{13}$, —$C_6OF_{13}$, —$C_7F_{15}$, or —$C_7OF_{15}$.

6. The method as claimed in claim 4, wherein:
R is —$CF_2CHF$—O—R', and
R' is —$C_mF_{2m}$—O—$C_nF_{2n+1}$, m and n are each independently an integer of 1 to 6, and (m+n) is an integer of 3 to 7.

7. The method as claimed in claim 6, wherein R is —$CF_2CHF$—O—$CF_2C(CF_3)F$—O—$(CF_2)_2CF_3$ or —$CF_2CHF$—O—$(CF_2)_3$—O—$CF_3$.

8. The method as claimed in claim 2, wherein:
the crosslinking molecule is represented by Formula 3, and
$R_f$ is —$(CH_2)_p(CF_2)_qCF_3$, in which p is an integer of 0 to 3 and q is an integer of 2 to 9.

9. A method of manufacturing a semiconductor device, the method comprising:
forming a photoresist material layer on a lower film, the photoresist material layer including a crosslinking molecule represented by Formula 1, Formula 2, or Formula 3;
exposing a partial region of the photoresist material layer;
removing an unexposed portion of the photoresist material layer to form a photoresist pattern; and
processing the lower film using the photoresist pattern,

[Formula 1]

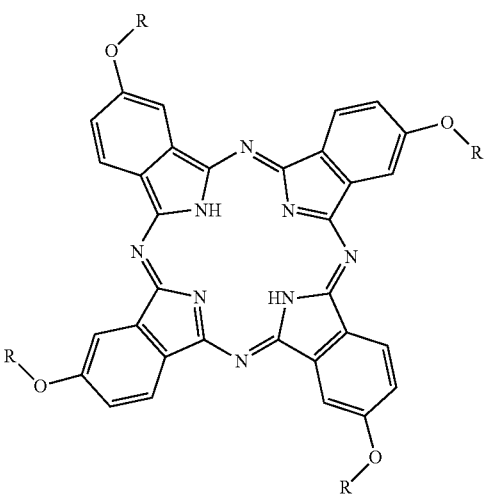

[Formula 2]

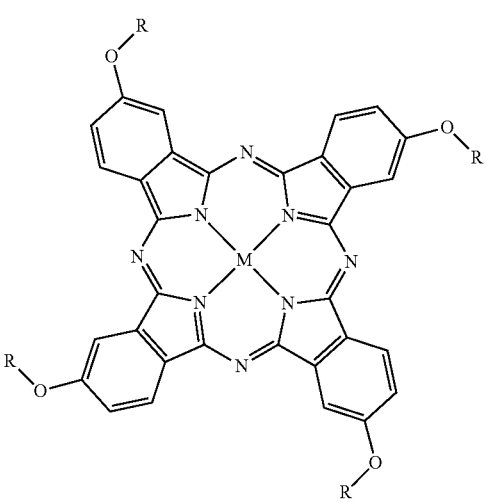

[Formula 3]

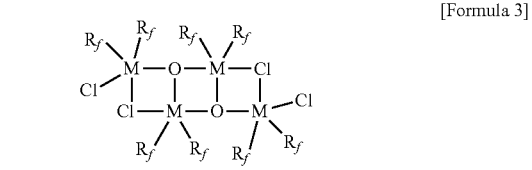

wherein, in Formulae 1 to 3,
M is tin (Sn), zinc (Zn), lithium (Li), sodium (Na), potassium (K), beryllium (Be), magnesium (Mg), calcium (Ca), barium (Ba), aluminum (Al), silicon (Si), cadmium (Cd), mercury (Hg), chromium (Cr), iron (Fe), cobalt (Co), nickel (Ni), copper (Cu), germanium (Ge), palladium (Pd), platinum (Pt), lead (Pb), strontium (Sr), or manganese (Mn), and R and $R_f$ are each independently $-C_aF_bH_c(N,P)_d(S,O)_e$, in which a is an integer of 1 to 20, each of d and e is independently an integer of 0 to 5, c is an integer of 0 to 20, $b \geq (a+c)$, and $(b+c)=2a+2+d$.

10. The method as claimed in claim 9, wherein the crosslinking molecule is represented by Formula 2, M is tin (Sn) or zinc (Zn), R is $-C_aF_bH_c(S,O)_e$, in which a is an integer of 5 to 10, e is an integer of 1 or 2, and c is an integer of 0 to 2.

11. The method as claimed in claim 10, wherein:

R is $-CF_2CHF-O-R'$, and

R' is $-C_3F_7$, $-C_3OF_7$, $-C_4F_9$, $-C_4OF_9$, $-C_5F_{11}$, $-C_5OF_{11}$, $-C_6F_{13}$, $-C_6OF_{13}$, $-C_7F_{15}$, or $-C_7OF_{15}$.

12. The method as claimed in claim 10, wherein:

R is $-CF_2CHF-O-R'$, and

R' is $-C_mF_{2m}-O-C_nF_{2n+1}$, in which m and n are each independently an integer of 1 to 6, and (m+n) is an integer of 3 to 7.

13. The method as claimed in claim 12, wherein R is $-CF_2CHF-O-CF_2C(CF_3)F-O-(CF_2)_2CF_3$ or $-CF_2CHF-O-(CF_2)_3-O-CF_3$.

14. The method as claimed in claim 9, wherein:

the crosslinking molecule is represented by Formula 1,

R is $-C_aF_bH_c(S,O)_e$, in which a is an integer of 5 to 10, e is 1 or 2, and c is an integer of 0 to 2.

15. The method as claimed in claim 14, wherein:

R is $-CF_2CHF-O-R'$,

R' is $-C_mF_{2m}-O-C_nF_{2n+1}$, in which each of m and n is an integer of 1 or more, and (m+n) is an integer of 3 to 7.

16. The method as claimed in claim 9, wherein:

the crosslinking molecule is represented by Formula 3, and $R_f$ is $-(CH_2)_p(CF_2)_qCF_3$, in which p is an integer of 0 to 3, and q is an integer of 2 to 9.

17. The method as claimed in claim 9, wherein:

the photoresist pattern includes a line-and-space pattern, a pitch of the line-and-space pattern is 36 nm or less, and a difference in width between two adjacent line patterns is 3 nm or less.

18. A method of manufacturing a semiconductor device, the method comprising:

forming a photoresist material layer on a lower film, the photoresist material layer including a crosslinking molecule represented by Formula 1, Formula 2-1, Formula 2-2, or Formula 3-1;

exposing a partial region of the photoresist material layer;

baking the photoresist material layer;

removing an unexposed portion of the baked photoresist material layer to form a photoresist pattern; and processing the lower film using the photoresist pattern,

[Formula 1]

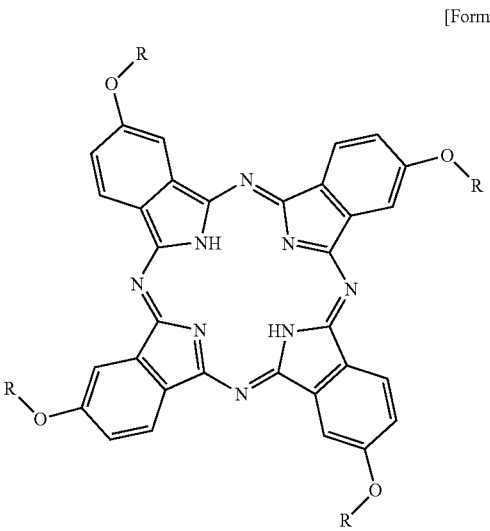

[Formula 2-1]

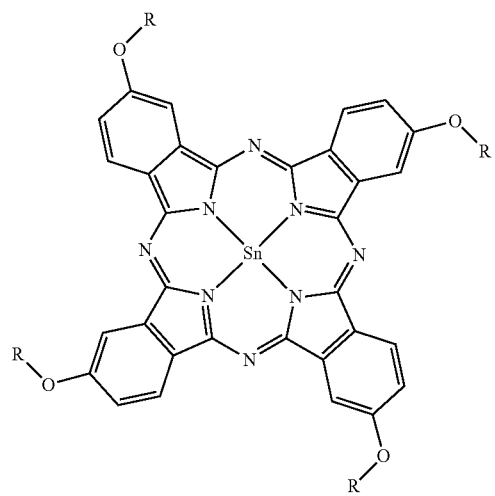

[Formula 2-2]

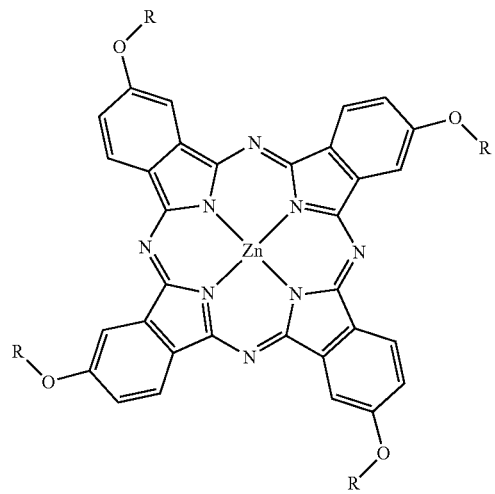

-continued

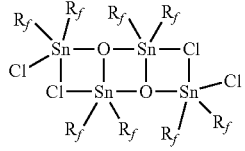

[Formula 3-1]

wherein, in Formulae 1 to 3-1, R is —$CF_2CHF$—O—R', in which R' is —$C_3F_7$, —$C_3OF_7$, —$C_4F_9$, —$C_4OF_9$, —$C_5F_{11}$, —$C_5OF_{11}$, —$C_6F_{13}$, —$C_6OF_{13}$, —$C_7F_{15}$, or —$C_7OF_{15}$, $R_f$ is —$(CH_2)_p(CF_2)_qCF_3$, in which p is an integer of 0 to 3, and q is an integer of 2 to 9.

19. The method as claimed in claim 18, wherein the crosslinking molecule is represented by Formula 1, Formula 2-1, or Formula 2-2.

20. The method as claimed in claim 18, wherein the photoresist material layer including the crosslinking molecule does not include a photoacid generator (PAG).

* * * * *